United States Patent
Nozuyama

(10) Patent No.: US 8,082,534 B2
(45) Date of Patent: Dec. 20, 2011

(54) APPARATUS AND METHOD FOR CALCULATING FAULT COVERAGE, AND FAULT DETECTION METHOD

(75) Inventor: Yasuyuki Nozuyama, Inashiro (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1422 days.

(21) Appl. No.: 11/604,886

(22) Filed: Nov. 28, 2006

(65) Prior Publication Data

US 2007/0201618 A1 Aug. 30, 2007

(30) Foreign Application Priority Data

Nov. 29, 2005 (JP) ................ P2005-344003

(51) Int. Cl.
*G06F 17/50* (2006.01)

(52) U.S. Cl. ............ 716/136; 716/52; 716/112; 702/59; 702/117

(58) Field of Classification Search .............. 716/111, 716/136; 714/30, 726; 702/117
See application file for complete search history.

(56) References Cited

U.S. PATENT DOCUMENTS

2005/0132254 A1* 6/2005 Shiota .......................... 714/30
2006/0005094 A1  1/2006 Nozuyama

FOREIGN PATENT DOCUMENTS

| JP | 07-121576 A | 5/1995 |
|---|---|---|
| JP | 11-052030 A | 2/1999 |
| JP | 2000-276500 A | 10/2000 |
| JP | 2003-107138 A | 4/2003 |
| JP | 2004-220447 A | 8/2004 |

OTHER PUBLICATIONS

Y. Nozuyama et al., "A Method for Estimating and Enhancing Test Quality Using Layout Information", Technical Report of IEICE, vol. CPM2002-152, Jan. 2003, pp. 1-6.
C.E. Stroud et al., "Bridging Fault Extraction from Physical Design Data for Manufacturing Test Development," Proc. IEEE International Test Conference, Oct. 2000, pp. 760-769.
S. Sengupta et al., "Defect-Based Test: A Key Enabler for successful Migration to Structural Test," Intel Technology Journal, 1999, pp. 1-14.

* cited by examiner

Primary Examiner — Vuthe Siek
(74) Attorney, Agent, or Firm — Foley & Lardner LLP

(57) ABSTRACT

A fault coverage calculating apparatus includes: an extraction module configured to extract information on a pair of wiring lines including a length of the pair adjacent within a predetermined distance range and a distance between the pair and bridge fault information corresponding to the pair from layout information of a semiconductor integrated circuit; a test module configured to perform a determination test for determining whether a bridge fault occurring in the pair is detected by using a bridge fault test pattern of a target; and a calculation module configured to calculate a bridge fault coverage to which the length and the distance are weighted, based on the information on the pair of wiring lines, the bridge fault information, a result of the determination test, and a bridge fault incidence depending on the distance.

19 Claims, 15 Drawing Sheets

FIG. 4

| DISTANCE BETWEEN WIRING LINES | 0 < DL ≤ d (SECTION SE1) | d < DL ≤ 2d (SECTION SE2) | 2d < DL ≤ 3d (SECTION SE3) |
|---|---|---|---|
| INFORMATION ON A PAIR OF WIRING LINES CORRESPONDING TO BRIDGE FAULT | (, L1:d1, LV1) + (LV3, L4:d4,) | (−LV1, L2:d2, LV2) | (−LV2, L3:d3, −LV3) |

FIG. 5

| DISTANCE BETWEEN WIRING LINES | 0 < DL ≤ d (SECTION SE1) | d < DL ≤ 2d (SECTION SE2) | 2d < DL ≤ 3d (SECTION SE3) |
|---|---|---|---|
| INFORMATION ON A PAIR OF WIRING LINES CORRESPONDING TO BRIDGE FAULT | (, L1, 1) + (2, L4,) | (−1, L2, 1) | (−1, L3, −2) |

FIG. 6

| DISTANCE BETWEEN WIRING LINES | 0 < DL ≤ d (SECTION SE1) | d < DL ≤ 2d (SECTION SE2) | 2d < DL ≤ 3d (SECTION SE3) |
|---|---|---|---|
| INFORMATION ON A PAIR OF WIRING LINES CORRESPONDING TO BRIDGE FAULT | L1 + L4 | L2 | L3 |

FIG. 7
| INFORMATION ON A PAIR OF WIRING LINES CORRESPONDING TO BRIDGE FAULT | SECTION | SE1 | SE2 | SE3 | DETERMINATION |
|---|---|---|---|---|---|
| | AVERAGE BRIDGE FAULT INCIDENCE | f1 | f2 | f3 | |
| P1 | INFORMATION ON A PAIR OF WIRING LINES | (1, L1, 1) | (−1, L2, 2) + (2, L4, −1) | (−2, L3, 1) | HD |
| P2 | | (1, L5, 1) + (2, L8, 1) | (−1, L6, −1) | (−1, L7, −2) | UD |
| P3 | | (1, L9, 1) | (−1, L10, −1) | 0 | HD |
FIG. 8
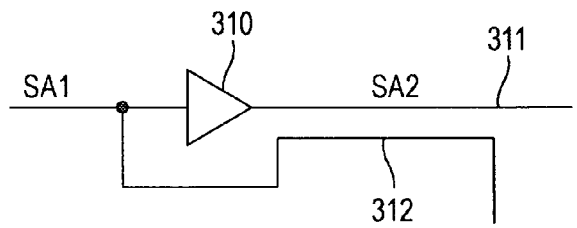
FIG. 9
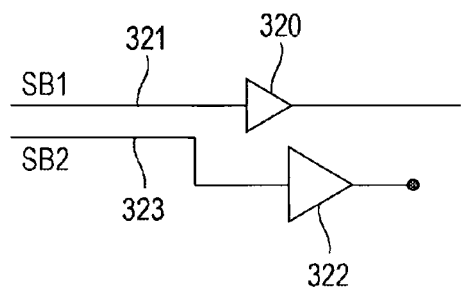

APPARATUS AND METHOD FOR CALCULATING FAULT COVERAGE, AND FAULT DETECTION METHOD

CROSS-REFERENCE TO RELATED APPLICATIONS

This application is based on and claims the benefit of priority from the prior Japanese Patent Application No. 2005-344003, filed on Nov. 29, 2005; the entire contents of which are incorporated herein by reference.

TECHNICAL FIELD

The present invention relates to a technique for detecting a fault from a semiconductor integrated circuit, and more particularly, to apparatus and method for calculating a fault coverage of a bridge fault test pattern, and a fault detection method.

BACKGROUND

With a progress in the fineness of a manufacturing process, the distance between wiring lines of a semiconductor integrated circuit (LSI) has been rapidly decreased. Therefore, it is expected that the incidence of a bridge fault occurring in the LSI will be increased. The 'bridge fault' occurs between adjacent wiring lines (hereinafter, referred to as 'a pair of wiring lines') due to a foreign material (dust) laid thereon, which causes a short circuit between the wiring lines.

In the related art, an IDDQ test easy to realize has been put to practical use as a bridge fault test for detecting a bridge fault. When a signal having a level of '1' is propagated through one of a pair of wiring lines having a bridge fault and a signal having a level of '0' is propagated through the other line, the IDDQ tester detects a DC current (abnormal IDDQ) value flowing in an LSI, thereby detecting the bridge fault. However, with a progress in the fineness of a manufacturing process, the IDDQ current value considerably increases in a fault-free LSI that operates at high speed, which makes it difficult to apply the IDDQ test.

Therefore, a bridge fault test (hereinafter, referred to as a 'logic-level bridge fault test') that inputs a bridge fault test pattern to an LSI and compares the logic values (levels) of output terminals with expected values, instead of measuring an IDDQ current, thereby detecting a bridge fault has become important as a bridge fault test applicable to the LSI. The following bridge fault tests have been proposed as logical bridge fault tests applicable to a large LSI: a simple bridge fault test capable of dealing with a wired-AND or wired-OR bridge fault; and a bridge fault test for accurately modeling a bridge fault by combining circuit information and layout information of an LSI.

When a bridge fault in a pair of wiring lines of an LSI is excited by the logical values of signals passing through the pair of wiring lines which are different from each other, there is a possibility that an erroneous operation will occur in a circuit in the next stage. The 'propagation of a bridge fault' means that an erroneous operation caused by an excitation of an bridge fault is propagated through circuits via a circuit in a stage next to a pair of wiring lines having the bridge fault. Since the bridge fault is propagated in the LSI, it is possible to detect the bridge fault at the output terminals of the LSI. It is determined whether a bridge fault is propagated in an LSI and whether the bridge fault may be detected at the output terminal of the LSI on the basis of the following factors: a driving circuit for outputting signals that are propagated through wiring lines having a bridge fault; an input to the driving circuit, the resistance value of bridge fault between the wiring lines; a receiving circuit to which a signal passing through the wiring lines having the bridge fault is input; and a threshold value of an input terminal to which the signal is input. Therefore, it is necessary to appropriately extract the layout information.

In the related art, a bridge fault test is to effectively extract a bridge fault from a large LSI, but it is not well considered to cope effectively with the correspondence between a bridge fault (defect) incidence and the layout information of an LSI. The layout information includes information on the detailed wiring and connection of basic cells, macro cells, wiring lines, and vias for connecting signal lines arranged in different wiring layers in an LSI (hereinafter, referred to as 'signal line layout information'). For example, the layout information includes detailed layout information of a GDS2 format (real layout level) and layout information after an optical proximity correction (OPC) process. In general, the signal line layout information is combined with information on the shape of the basic cells and the macro cells and the position of terminals and information on a design rule, such as the minimum distance between wiring lines into complete information. From the viewpoint of the estimation of a bridge fault incidence, a tool for accurately extracting a critical area on the basis of data of the layout information of the GDS2 format and the layout information after the OPC process and accurately estimating a yield is already on the market. The 'critical area' means an area of an LSI in which wiring lines are closely arranged.

However, in the above-mentioned tool, it is difficult to associate the layout information with a logic net list, which is electrical connection information of an LSI. Therefore, it is difficult to feed back the result of a bridge fault test performed for signals on the logic net list to the layout information and to extract information in order to estimate the quality of a bridge fault test which has a strong correlation to the bridge fault incidence or effectively improve the quality of the test. The 'test quality' is generally estimated by the fault coverage. Since the layout information has a large amount of data, there is a problem in that it takes a lot of time to process the layout information.

The signal line layout information can be used to estimate the quality of the test to some extents (for example, see JP-A-2003-107138). That is, an appropriate close distance is set, and a pair of wiring lines that are adjacent to each other at a distance smaller than the close distance are extracted together with the length of the pair of wiring lines. Bridge fault test patterns generated by an automatic test pattern generating tool (program) are applied to the pairs of wiring lines (bridge faults) or a bridge fault test tool to estimate a bridge fault coverage by general test patterns, such as fault simulation, is applied to the pairs of wiring lines. A weighted fault coverage is defined by considering the length of the wiring lines. Actually, as the distance between the pair of wiring lines becomes larger, the bridge fault incidence is rapidly lowered. However, the above-mentioned method does not consider the influence of the above, and does not reflect the layout information to the bridge fault coverage with high accuracy.

As described above, a method of estimating the quality of a bridge fault test considering layout information, that is, a method of accurately calculating a fault coverage of bridge fault test patterns is not disclosed. Therefore, it is difficult to take an effective measure to reduce the incidence of bridge faults using the result of a bridge fault test.

SUMMARY

According to an aspect of the invention, there is provided a fault coverage calculating apparatus comprising: an extraction module configured to extract information on a pair of wiring lines including a length of the pair of wiring lines adjacent to each other within a predetermined distance range and a distance between the pair of wiring lines and bridge fault information corresponding to the pair of wiring lines from layout information of a semiconductor integrated circuit; a test module configured to perform a determination test for determining whether a bridge fault occurring in the pair of wiring lines which is a target of fault coverage calculation is detected or not by using a bridge fault test pattern; and a calculation module configured to calculate a bridge fault coverage to which the length of the pair of wiring lines and the distance between the pair of wiring lines in the bridge fault test pattern are weighted, based on the information on the pair of wiring lines, the bridge fault information corresponding to the pair of wiring lines, a result of the determination test, and a bridge fault incidence depending on the distance between the pair of the wiring lines.

According to another aspect of the invention, there is provided a calculation method of a fault coverage, comprising: extracting information on a pair of wiring lines including a length of the pair of wiring lines adjacent to each other within a predetermined distance range and a distance between the pair of wiring lines and bridge fault information corresponding to the pair of wiring lines form layout information of a semiconductor integrated circuit included in a layout information area; storing the information on the pair of wiring lines in a wiring information area; storing the bridge fault information in a fault information area; perform a determination test for determining whether a bridge fault occurring in the pair of wiring lines which is a target of fault coverage calculation is detected or not by using a bridge fault test pattern; storing a result of the determination test in a determination result area; and calculating a bridge fault coverage to which the length of the pair of wiring lines and the distance between the pair of the wiring lines in the bridge fault test pattern are weighted, based on the information on the pair of wiring lines, the bridge fault information of the pair of wiring lines, a result of the determination test including information on whether the bridge fault occurring in the pair of wiring lines is detected, and a bridge fault incidence depending on the distance between the pair of wiring lines which are read out from the wiring information area, the determination result area, and the fault incidence area, respectively.

According to still another aspect, there is provided a fault detecting method, comprising: extracting information on a pair of wiring lines including a length of the pair of wiring lines adjacent to each other within a predetermined distance range and a distance between the pair of wiring lines and bridge fault information corresponding to the pair of wiring lines from layout information of a semiconductor integrated circuit included in a layout information area; storing the information on the pair of wiring lines in a wiring information area; storing the bridge fault information in a fault information area; perform a determination test for determining whether a bridge fault occurring in the pair of wiring lines which is a target of fault coverage calculation is detected on not by using a bridge fault test pattern is detected; storing a result of the determination test in a determination result area; calculating a bridge fault coverage to which the length of the pair of wiring lines and the distance between the pair of wiring lines in the bridge fault test pattern are weighted, based on the information on the pair of wiring lines, the bridge fault information of the pair of wiring lines, the result of the determination test including information on whether the bridge fault occurring in the pair of wiring lines is detected, and a bridge fault incidence depending on the distance between the pair of wiring lines which are read out from the wiring information area, the determination result area, and the fault incidence area, respectively; and allowing an LSI tester to apply the bridge fault test pattern whose bridge fault coverage is calculated to perform a bridge fault detection test on the semiconductor integrated circuit.

BRIEF DESCRIPTION OF THE DRAWINGS

FIG. 4 is an exemplary diagram illustrating information on a pair of wiring lines extracted from the fault coverage calculating apparatus according to the first embodiment.

FIG. 5 is an exemplary diagram illustrating another example of the information on a pair of wiring lines extracted from the fault coverage calculating apparatus according to the first embodiment.

FIG. 6 is an exemplary diagram illustrating still another example of the information on a pair of wiring lines extracted from the fault coverage calculating apparatus according to the first embodiment.

FIG. 7 is an exemplary diagram illustrating an example of information on a pair of wiring lines, the determination result, and a bridge fault incidence used in a fault coverage calculating method according to the first embodiment.

FIG. 8 is an exemplary circuit diagram schematically illustrating an example of a redundant fault.

FIG. 9 is an exemplary circuit diagram schematically illustrating another example of the redundant fault.

DESCRIPTION OF THE EMBODIMENTS

Figure 1:
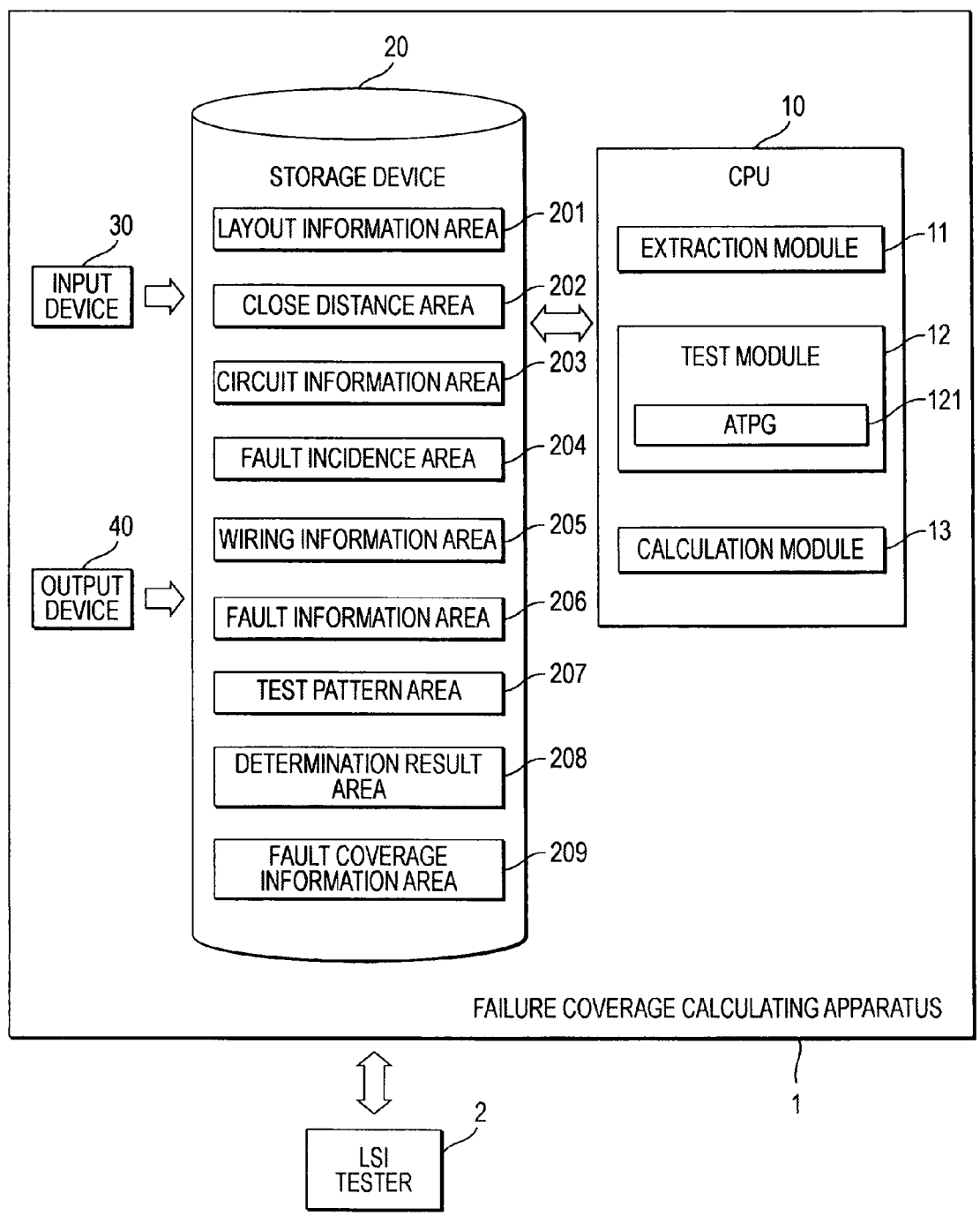
FIG. 1 is an exemplary diagram schematically illustrating a structure of a fault coverage calculating apparatus according to a first embodiment of the invention.

Hereinafter, first to fourth embodiments of the invention will be described with reference to the accompanying drawings. In the following drawings, the same or similar components have the same or similar reference numerals. Apparatuses and methods according to the first to fourth embodiments of the invention are just illustrative examples for realizing the technical idea of the invention, but the technical idea of the invention is not limited to the structure of a constituent component and the arrangements of components. Various modifications and changes of the invention can be made without departing from the scope of the invention.

First Embodiment

As show in FIG. 1, a fault coverage calculating apparatus 1 includes an extraction module 11, a test module 12, and a calculation module 13. The extraction module 11 extracts information on a pair of wiring lines including the lengths of a pair of wiring lines adjacent to each other within a predetermined distance range (hereinafter, referred to as "a close distance range") and the distance between the pair of wiring lines and bridge fault information corresponding to the pair of adjacent wiring lines from LSI layout information. The test module 12 performs a test for determining whether a bridge fault occurs in a pair of adjacent wiring lines as an object of fault coverage calculation by a bridge fault test pattern is detected or not. The calculation module 13 calculates a bridge fault coverage that is weighted by the lengths of wiring lines of the bridge fault test pattern and the distance between the wiring lines, on the basis of the information on the pair of wiring lines, the bridge fault information of the pair of wiring lines, the result obtained by the determination test, and a bridge fault incidence depending on the distance between the wiring lines. The extraction module 11 also extracts information related to primitive cells for driving the pair of adjacent wiring lines from the LSI layout information, according to circumstances. The extraction module 11 also has a function of converting the pair of adjacent wiring lines into a bridge fault that can be processed by the test module 12.

The 'close distance' is set as the distance between wiring lines occurring the bridge fault. For example, the distance between wiring line at which the probability of the bridge fault occurring (bridge fault incidence) is higher than a predetermined probability is set as the close distance, on the basis of, for example, the distribution of the bridge fault incidence with respect to the distance between wiring lines. The bridge fault incidence depends on the distance between the pair of wiring lines. In general, the larger the distance between the pair of wiring lines becomes, the lower the bridge fault incidence becomes. The bridge fault incidence is calculated from, for example, the evaluation of a test element group (TEG) or the result of the bridge fault test of the LSI that was manufactured in the past. The fault coverage calculating apparatus 1 shown in FIG. 1 calculates the fault coverage of the bridge fault occurring in a region in which the distance between a pair of adjacent wiring lines is equal to or smaller than the close distance.

For example, the close distance can be set on the basis of, for example, the minimum pitch between wiring lines of an LSI (hereinafter, referred to as a 'target LSI') to which the bridge fault test pattern is applied. More specifically, an integral multiple of the minimum pitch between the wiring lines is set to the close distance. Alternatively, the close distance may be set on the basis of (rough) information on the size distribution of dust on a wafer that is detected in a process used to manufacture the target LSI. For example, the maximum size of dust is set to an upper limit, or the size of dust whose number is largest is set to the close distance. The size distribution of dust is obtained from, for example, the dust examination result of a process using a TEG or some product that was manufactured in the past by the same process as that in which the target LSI is formed.

As described above, the bridge fault is activated or excited due to a short-circuit between a pair of wiring lines, depending on a combination of signals passing through the pair of wiring lines, and the bridge fault is propagated beyond circuits in the next stage. The bridge fault corresponding to a pair of adjacent wiring lines means a bridge fault activated in a pair of adjacent wiring lines.

As shown in FIG. 1, the extraction module 11, the test module 12, and the calculation module 13 are included in a central processing unit (CPU) 10. The fault coverage calculating apparatus 1 supplies a bridge fault test pattern to a tester 2 for performing a bridge fault test on an LSI.

A storage device 20 includes a layout information area 201, a close distance area 202, a circuit information area 203, a fault incidence area 204, a wiring information area 205, a fault information area 206, a test pattern area 207, a determination result area 208, and a fault coverage information area 209. The layout information area 201 stores layout information of a target LSI. The layout information includes, for example, signal line layout information and signal line layout basic information composed of basic information, such as the shape of a basic cell included in the signal line layout information, positional information of terminals, design rules such as the diameters of wiring lines in each layer, minimum pitch or distance between wiring lines, and the outward shape of a via. The close distance area 202 stores a predetermined close distance. The circuit information area 203 stores circuit information, such as information on the electrical connection of target LSIs. The fault incidence area 204 stores the bridge fault incidence that has already been acquired. The wiring information area 205 stores information on a pair of wiring lines that is extracted from the layout information. The fault information area 206 stores bridge fault information created on the basis of information on a pair of wiring lines. The test pattern area 207 stores a bridge fault test pattern that is used for a bridge fault (detection) test. The determination result area 208 stores the result obtained by the (determination) test, that is, information on the detection (non-detection) of each bridge fault by the bridge fault test pattern. The fault coverage information area 209 stores the calculated bridge fault coverage and non-detected fault information aligned in the order of the degree of importance.

An input device 30 is composed of, for example, a keyboard, a mouse, a write pen, or a flexible disk device. A user can use the input device 30 to designate the layout information or circuit information used to calculate a fault coverage (to calculate the weighted fault coverage and to output the weighted non-detection faults with each weight), or to set the close distance. In addition, the user can use the input device 30 to input an instruction to calculate the fault coverage or to stop calculating the fault coverage.

For example, a display device for displaying the fault coverage, a printer, or a recording device for recording information on a computer readable storage medium can be used as an output device 40. The 'computer readable storage medium' means a medium capable of storing electronic data, such as an external memory device of a computer, a semiconductor memory, a magnetic disk, or an optical disk. Specifically, the 'computer readable storage medium' includes a flexible disk, a CD-ROM, and an MO disk.

Figure 2:
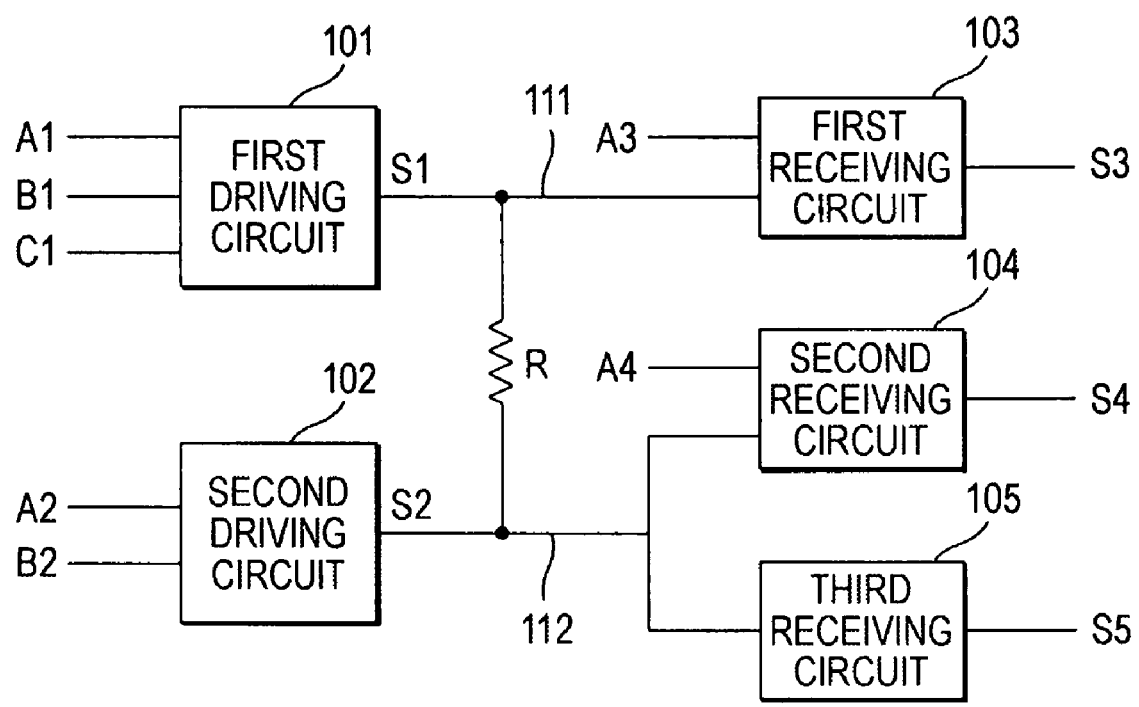
FIG. 2 is an exemplary circuit diagram schematically illustrating an example of a bridge fault.

FIG. 2 shows an example of the bridge fault. FIG. 2 shows an example of the bridge fault in which a wiring line 111 for connecting a first driving circuit 101 and a first receiving circuit 103 is connected to a wiring line 112 for connecting a second driving circuit 102, a second receiving circuit 104, and a third receiving circuit 105 through a resistor R. Signals A1, B1, and C1 are input to the first driving circuit 101, and signals A2 and B2 are input to the second driving circuit 102. A signal A3 is input to the first receiving circuit 103, and the first receiving circuit 103 outputs a signal S3. A signal A4 is input to the second receiving circuit 104, and the second receiving circuit 104 outputs a signal S4. The third receiving circuit 105 outputs a signal S5.

The relationship among logical threshold values of input terminals of the first to third receiving circuit 103 to 105 and potentials V1 and V2 of connection points between the wiring lines 111 and 112 and the resistor R determines whether the bridge fault is propagated through the first receiving circuit 103, the second receiving circuit 104, and the third receiving circuit 105. For example, when the bridge fault is not activated (excited), the potential V1 is lower than the logical threshold value of the input terminal of the first receiving circuit 103 at the time when the signal S1=0. However, when the signal S2=1 is output, the bridge fault shown (assumed) in FIG. 2 is activated, causing the potential V1 to be higher than the logical threshold value of the input terminal of the first receiving circuit 103. In this case, the bridge fault is propagated through the first receiving circuit 103. That is, when the output of the first receiving circuit 103 varies according to the active or inactive state of the bridge fault, the bridge fault is propagated. Whether the output of the first receiving circuit 103 varies when the bridge fault is activated also depends on the level of the signal A3 input to the first receiving circuit 103. The potentials V1 and V2 depend on the resistance value of the resistor R, the levels of the signals A1, B1, and C1 input to the first receiving circuit 101, and the levels of the signals A2 and B2 input to the second driving circuit 102. Here, the 'level' means a high level or a low level. As described above, when the signals S1 and S2 are set to have different levels and an 'error' signal (an erroneous signal) occurring due to the activation of the bridge fault between the wiring lines 111 and 112 is propagated to the output terminal of an LSI, the bridge fault between the wiring lines 111 and 112 can be propagated finally to the output terminals of an LSI and detected.

Figure 3:
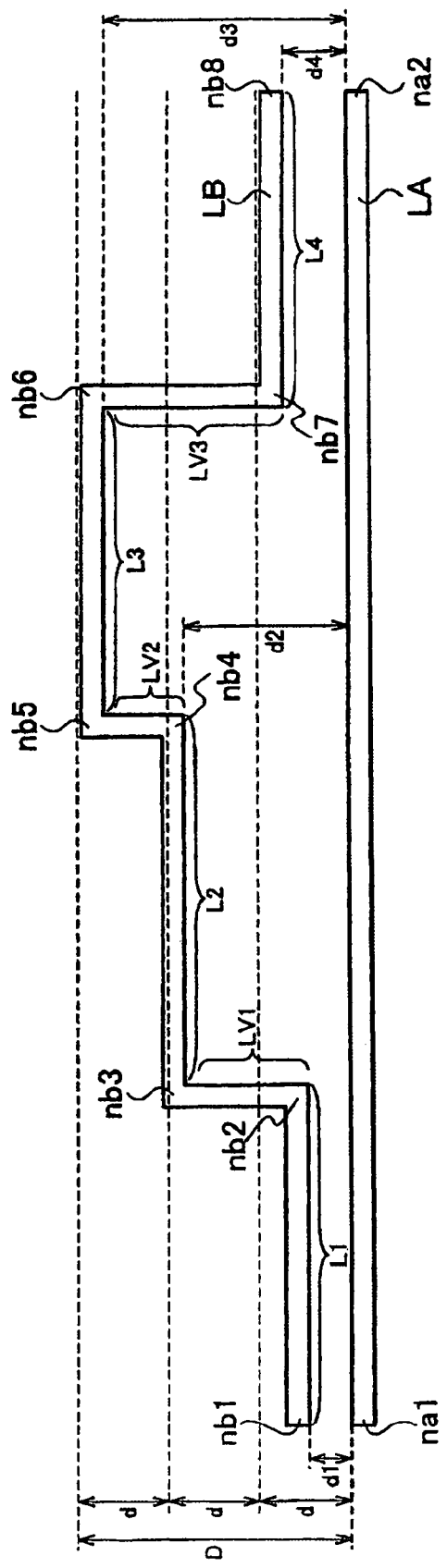
FIG. 3 is an exemplary top view illustrating an example of the layout of a pair of wiring lines.

FIG. 3 shows an example of the layout of a pair of wiring lines (hereinafter, referred to as 'a pair of adjacent wiring lines') that are separated from each other at a distance DL that is smaller than a close distance D. FIG. 3 shows the layout of a pair of wiring lines LA and LB formed in the same wiring layer. Here, the distance DL between the wiring lines is the distance between the surfaces of the wiring lines LA and LB. However, the distance DL between the wiring lines may be the distance between central lines passing through the centers of the wiring lines LA and LB. The length of parts of the wiring lines LA and LB adjacent to each other is referred to as 'the length of adjacent wiring lines'.

A node na1 and a node na2 shown in FIG. 3 are both ends of the wiring line LA. A node nb1 and a node nb8 are both ends of the wiring line LB. Nodes nb2 to nb7 are bent portions of the wiring line LB. As shown in FIG. 3, the length of adjacent wiring lines between the nodes nb1 and nb2 is L1, the length of adjacent wiring lines between the nodes nb2 and nb3 is LV1, the length of adjacent wiring lines between the nodes nb3 and nb4 is L2, the length of adjacent wiring lines between the nodes nb4 and nb5 is LV2, the length of adjacent wiring lines between the nodes nb5 and nb6 is L3, the length of adjacent wiring lines between the nodes nb6 and nb7 is LV3, and the length of adjacent wiring lines between the nodes nb7 and nb8 is L4. The lengths L1 to L3 of adjacent wiring lines are the length of the wiring line LB extending in parallel to a direction in which the wiring line LA extends. The lengths LV1 to LV3 of adjacent wiring lines are the length of the wiring line LB extending vertical to a direction in which the wiring line LA extends. As shown in FIG. 3, the distance from the wiring line LA to the wiring line LB between the nodes nb1 and nb2 is d1, the distance from the wiring line LA to the wiring line LB between the nodes nb3 and nb4 is d2, the distance from the wiring line LA to the wiring line LB between the nodes nb5 and nb6 is d3, and the distance from the wiring line LA to the wiring line LB between the nodes nb7 and nb8 is d4.

A divided distance d shown in FIG. 3 is set to add a weight value of the distance between a pair of adjacent wiring lines and the length of adjacent wiring lines to the bridge fault coverage, which will be described later. In the following description, in the distance DL between the wiring lines, a section having a distance that is larger than $(n-1) \cdot d$ (d is the divided distance) and is equal to or smaller than $n \cdot d$ is referred to as a section SEn (n is an integer equal to or greater than 1). For example, a distance section in which the distance DL between the wiring lines is equal to or smaller than the divided distance d is referred to as a section SE1, a distance section in which the distance DL between the wiring lines is larger than the divided distance d and is equal to or smaller than twice the divided distance d is referred to as a section SE2, and a distance section in which the distance DL between the wiring lines is larger than twice the divided distance d and is equal to or smaller than three times the divided distance d is referred to as a section SE3. That is, in FIG. 3, the divided distance d is set to a third of the close distance D, and the distance DL between the wiring lines is divided into three sections SE1 to SE3. However, the distances included in the sections SE1 to SE3 may be set to have different values.

In the pair of adjacent wiring lines shown in FIG. 3, information on the pair of wiring lines shown in FIG. 4 is extracted from layout information. FIG. 4 is a table showing adjacent portions of a pair of adjacent wiring lines divided into eight parts, that is, the nodes nb1 to nb8 and the length of adjacent wiring lines between the nodes classified according to the distance DL between the wiring lines. In the following description, the divided parts of the pair of adjacent wiring lines are referred to as 'adjacent parts', and each of the divided parts is represented by, for example, an adjacent part {nb1, nb2}. The adjacent part {nb1, nb2} is an adjacent part between the nodes nb1 and nb2.

In FIG. 4, information on each adjacent part of the pair of wiring lines is represented by '(x1, x2, x3)' by using terms x1, x2, and x3. The term x1 indicates the length of an adjacent part connected to the left end of FIG. 3. The term x2 indicates the length of each adjacent part and the distance between the wiring lines, and the length of the adjacent part and the distance between the wiring lines are divided from each other with a colon ':' interposed therebetween. The term x3 indicates the length of an adjacent part connected to the right end of FIG. 3. Since the adjacent part {nb1, nb2} has no adjacent part connected to the left end, the term x1 is blank. Since an adjacent part {nb7, nb8} has no adjacent part connected to the right end, the term x3 is blank. In FIG. 4, when adjacent parts corresponding to the terms x1 and x3 extend in a direction in which the distance between the adjacent parts corresponding to the terms x1 and x3 and end portions connected to an adjacent part corresponding to the term x2 is reduced (that is, the value of the term x2 is reduced), the negative signs '−' are attached to the terms x1 and x3.

The information on the pair of wiring lines shown in FIG. 4 can be used to accurately calculate the fault coverage of the bridge fault test pattern. However, when the target LSI is a large LSI, it takes a lot of time to extract the information on the pair of wiring lines shown in FIG. 4 from the layout information. In order to shorten the time required to extract the information on the pair of wiring lines from the layout information, it is effective to assume that the distance of the adjacent parts in the section SEn is fixed to the average distance between the wiring lines in the section SEn. FIG. 5 shows information on the pair of adjacent wiring lines shown in FIG. 3 when the distance between the wiring lines in an adjacent part is set to the average distance between the wiring lines in the section SEn. The distance of the adjacent part in the section SEn is the average distance between the wiring lines in the section SEn (n−½)×d or some fixed value based on detailed extraction of distance between the wiring lines, but the distance between the wiring lines is omitted in FIG. 5 (, which can be stored, for example, in the close distance area 202). As seen in FIG. 5, the lengths of adjacent wiring lines of the terms X1 and x3 are represented by the ratio of the length of adjacent wiring lines to the divided distance d.

Moreover, since the bridge fault incidence is low in parts of the wiring lines that extend orthogonal to each other, it is possible to neglect the bridge fault incidence in parts connected to both ends of each adjacent part. FIG. 6 shows information on a pair of wiring lines obtained by removing information on the parts connected to both ends of an adjacent part from the information on a pair of wiring lines shown in FIG. 5. As shown in FIG. 6, the length of adjacent parts, i.e., adjacent wiring lines in the section SE1 is L1+L4, the length of adjacent part in the section SE2 is L2, and the length of adjacent part in the section SE3 is L3.

FIGS. 4 to 6 show examples of notations of the information on a pair of wiring lines. Values added to or subtracted from the terms may be represented in the tables shown in FIGS. 4 to 6. The information on a pair of wiring lines may be represented by other notations. The information on a pair of wiring lines is not output in the form of the tables shown in FIGS. 4 to 6, but it may be stored in the form of electronic information, such as database.

The calculation of the bridge fault coverage of the bridge fault test pattern by the calculation module 13 shown in FIG. 1 will be described below (in case of an IDDQ test, information on a pair of wiring lines is the same as bridge fault pair information). The calculation module 13 uses bridge fault information obtained from information on a pair of wiring lines, the result (detection information) of the determination test, and the bridge fault incidence to calculate the (weighted) bridge fault coverage of the bridge fault test pattern that is weighted by the length of adjacent wiring lines and the bridge fault incidence depending on the distance between a pair of adjacent wiring lines. For a better understanding of the invention, FIG. 7 shows an example of a table having information on a pair of wiring lines, the result of determination (detection information), and the bridge fault incidence described therein.

FIG. 7 shows information (bridge fault information) on a pair P1 of adjacent wiring lines LA and LB, a pair P2 of adjacent wiring lines LC and LD, and a pair P3 of adjacent wiring lines LE and LF, the determination results (detection information) thereof, and the bridge fault incidences thereof. FIG. 7 shows information on pairs of adjacent wiring lines in the same manner as that shown in FIG. 5. In the pair P1 of adjacent wiring lines, information items on a pair of wiring lines in the sections SE1, SE2, and SE3 are (1, L1, 1), (−1, L2, 2)+(2, L4, −1), and (−2, L3, 1). In the pair P2 of adjacent wiring lines, information items on a pair of wiring lines in the sections SE1, SE2, and SE3 are (1, L5, 1)+(2, L8, 1), ·(−1, L6, −1), and (1, L7, −2). In the pair P3 of adjacent wiring lines, information items on a pair of wiring lines in sections SE1 and SE2 are (1, L9, 1) and (−1, L10, −1). The result of determination (detection information) by the test module 12 is described in a field 'determination' of FIG. 7.

Average bridge fault incidences f1 to f3 shown in FIG. 7 are the average values of the bridge fault incidences in the sections SE1 to SEn. Characters 'HD' described in the field 'determination' means detection, and characters 'UD' described in the field 'determination' means non-detection. That is, the bridge fault in the pair P1 of adjacent wiring lines and the pair P3 of adjacent wiring lines is detected by the bridge fault test pattern, and the bridge fault in the pair P2 of adjacent wiring lines is not detected.

The calculation module 13 calculates a weighted bridge fault coverage W_BFC of the bridge fault test pattern, which considers the average bridge fault incidence of the sections SE1 to SEn, by using the following Expression 1:

$$W\_BFC = \Sigma(fi \times (DLi + \Delta DLi)) / \Sigma(fi \times (ALi + \Delta ALi)).$$ [Expression 1]

In Expression 1, 'Σ' means the sum of values of i from 1 to n, and 'fi' means the average bridge fault incidence in a section SEi. As a variable i is smaller, the distance between the wiring lines in the section SEi becomes smaller, and the average bridge fault incidence fi becomes higher. DLi indicates the length of adjacent parts of a pair of wiring lines in the section SEi in which the bridge fault can be detected, and $\Delta DLi$ indicates the correction length of end portions of each adjacent part in the section SEi. The correction length of the end portions will be described later. ALi indicates the length of adjacent parts in the section SEi of all pairs of wiring lines included in a target LSI, and $\Delta ALi$ indicates the correction length of end portions of each adjacent part of all the pairs of wiring lines in the section SEi. Here, the length ALi of adjacent wiring lines does not include the length of parts of adjacent wiring lines corresponding to redundant faults, which are unable to be detected by any bridge fault test pattern. Therefore, the weighted bridge fault coverage W_BFC of the bridge fault test pattern with respect to the pair P1 of adjacent wiring lines, the pair P2 of adjacent wiring lines, and the pair P3 of adjacent wiring lines shown in FIG. 7 is calculated by the following Expression 2:

$$W\_BFC = \{f1 \times (DL1 + \Delta DL1) + f2 \times (DL2 + \Delta DL2) + f3 \times (DL3 + \Delta DL3)\} / \{f1 \times (AL1 + \Delta AL1) + f2 \times (AL2 + \Delta AL2) + f3 \times (AL3 + \Delta AL3)\}.$$ [Expression 2]

Here, the following Expressions 3 to 14 are established:

$$DL1 = L1 + L9,$$ [Expression 3]

$$\Delta DL1 = \Delta L1 + \Delta L9,$$ [Expression 4]

$$DL2 = L2 + L4 + L10,$$ [Expression 5]

$$\Delta DL2 = \Delta L2 + \Delta L4 + \Delta L10,$$ [Expression 6]

$$DL3 = L3,$$ [Expression 7]

$$\Delta DL3 = \Delta L3,$$ [Expression 8]

$$AL1 = L1 + L5 + L8 + L9,$$ [Expression 9]

$$\Delta AL1 = \Delta L1 + \Delta L5 + \Delta L8 + \Delta L9, \quad \text{[Expression 10]}$$

$$AL2 = L2 + L4 + L6 + L10, \quad \text{[Expression 11]}$$

$$\Delta AL2 = \Delta L2 + \Delta L4 + \Delta L6 + \Delta L10, \quad \text{[Expression 12]}$$

$$AL3 = L3 + L7, \text{ and} \quad \text{[Expression 13]}$$

$$\Delta AL3 = \Delta L3 + \Delta L7. \quad \text{[Expression 14]}$$

As shown in Expression 1, the calculation module 13 calculates the products of the average bridge fault incidences f1 to fn and the sum of the length DLi of adjacent wiring lines and the correction length ΔDLi in the sections SE1 to SEn for every pair of adjacent wiring lines. In the following description, the sum of the products of the average bridge fault incidences f1 to fn and the sum of the length DLi of adjacent wiring lines and the correction length ΔDLi in the sections SE1 to SEn for every pair of adjacent wiring lines is referred to as a 'weight WT' of the pair of adjacent wiring lines.

The 'correction length of the end portions' means the length of a wiring line when adjacent parts connected to both ends of each adjacent part is regarded as a portion of a wiring line included in each adjacent part. It is possible to calculate the fault coverage considering the bridge fault in a wiring line that extends vertical to a direction in which each adjacent part extends, in the adjacent parts connected to both ends of each adjacent part, by adding the correction length of the end portions to the length of adjacent wiring lines. The correction length ΔDLi and the correction length ΔALi of both ends of an adjacent part are defined by the following Expression 15, and are calculated for every adjacent part.

$$\Delta DLi = (x1 + x3) \times d/2. \quad \text{[Expression 15]}$$

In Expression 15, x1 and x3 indicate the values of the terms x1 and x3 of the information on a pair of wiring lines shown in FIG. 5. Suppose that both the correction length ΔDLi and the correction length ΔALi are zero, the shorter the distance between wiring lines becomes, the lower the bridge fault incidence becomes. However, the bridge fault incidence occurring in the wiring lines extending orthogonal to each other is considerably lower than the bridge fault incidence occurring in the wiring lines extending parallel to each other. Therefore, in practical, both the correction length ΔDLi and the correction length ΔALi may be set to zero to calculate the weighted bridge fault coverage W_BFC.

FIGS. 8 and 9 show examples of a redundant fault of the bridge fault. FIG. 8 shows wiring lines 311 and 312 through which a signal SA1 and an output signal SA2 of a buffer circuit 310 that propagates the signal SA1 without converting the level of the signal SA1 are propagated. Since the signals SA1 and SA2 always have the same level values, it is difficult to detect the bridge fault between the wiring lines 311 and 312.

FIG. 9 shows a wiring line 321 for propagating a signal SB1 input to a buffer circuit 320 and a wiring line 323 for propagating a signal SB2 input to a buffer circuit 322. However, a signal output from the buffer circuit 322 is not propagated to another circuit, and is not output to the outside of an LSI. When an error signal of the bridge fault between the wiring lines 321 and 323 carries the signal SB2 through the buffer circuit 322, the bridge fault between the wiring lines 321 and 323 cannot be detected.

Next, a method of calculating a fault coverage of a bridge fault test pattern as a metric of the quality of a bridge fault test and using the bridge fault test pattern whose fault coverage has been calculated to perform a bridge fault test on a target LSI by using the fault coverage calculating apparatus 1 shown in FIG. 1 will be described with reference to a flow chart shown in FIG. 10. A method of calculating a fault coverage using a pair of adjacent wiring lines shown in FIG. 3 will be described below. The fault coverage is calculated assuming that the distance between adjacent parts of a pair of wiring lines in the section SEn is the average distance between the wiring lines (n−½)×d.

In step S10, layout information of a target LSI is stored in the layout information area 201 through the input device 30 shown in FIG. 1. In addition, a predetermined close distance D is stored in the close distance area 202 through the input device 30.

In step S20, circuit information of the target LSI is stored in the circuit information area 203. The layout information and the circuit information of the target LSI are stored so as to be associated with each other, and a wiring line included in the layout information can correspond to a signal line included in the circuit information.

In step S30, the bridge fault incidence depending on the distance DL between wiring lines is stored in the fault incidence area 204 through the input device 30. Here, the bridge fault incidence includes the average bridge fault incidences f1 to fn in the sections SE1 to SEn. If there is not exact information on bridge fault incidences, it is possible to input relative values for example f1=1 and f2, f3, . . . following rough dependency on the distance between adjacent wiring lines.

In step S40, the extraction module 11 reads out the layout information and the close distance D from the layout information area 201 and the close distance area 202, respectively. The extraction module 11 extracts a pair of adjacent wiring lines that are separated from each other at a distance DL smaller than the close distance D from a plurality of pairs of wiring lines included in the layout information. In addition, the extraction module 11 extracts information on the extracted pair of adjacent wiring lines that include the length of adjacent wiring lines and the distance DL between the wiring lines from the layout information. For example, information on a pair of wiring lines shown in FIG. 5 is extracted from the pair of adjacent wiring lines shown in FIG. 3. When a target LSI includes a plurality of pairs of adjacent wiring lines, information on a pair of wiring lines is extracted from each pair of adjacent wiring lines. The extracted pair of adjacent wiring lines and the extracted information on the pair of adjacent wiring lines are stored in the wiring information area 205. The extraction module 11 extracts related information, such as a basic cell for driving each signal of a pair of wiring lines, creates a bridge fault corresponding to each pair of wiring lines, and stores the bridge fault in the fault information area 206.

In step S50, the test module 12 reads out the bridge fault from the fault information area 206. In addition, the test module 12 reads out the circuit information from the circuit information area 203. The test module 12 performs a determination test for regarding a bridge fault corresponding to a pair of adjacent wiring lines as a target to be detected. That is, when a bridge fault occurs in the extracted pair of adjacent wiring lines, the test module 12 determines whether the bridge fault is detected by a logical bridge fault test. More specifically, an automatic test pattern generator (ATPG) 121 included in the test module 12 generates a bridge fault test pattern of a target LSI on the basis of the circuit information. It is determined by the generated bridge fault test pattern whether the bridge fault occurring in each pair of wiring lines included in the circuit information is detected. Since the circuit information and the layout information are associated with each other, it is possible to determine whether the bridge fault occurring in a pair of adjacent wiring lines extracted from the layout information is detected. The bridge fault coverage of the bridge fault test pattern generated by the ATPG 121 is calculated by the fault coverage calculating apparatus 1 shown in FIG. 1. The generated bridge fault test pattern and the result determined by the determination test are stored in the test pattern area 207 and the determination result area 208, respectively.

In step S60, the calculation module 13 reads out the information on a pair of wiring lines, the determination result including information on the detection (non-detection) of a bridge fault corresponding to a pair of wiring lines, and the bridge fault incidence from the wiring information area 205, the determination result area 208, and the fault incidence area 204, respectively. The calculation module 13 calculates the weighted bridge fault coverage W_BFC of the bridge fault test pattern by using Expression 1 on the basis of the adjacent part (length) of adjacent wiring lines, the bridge fault incidence and the determination result related to the detection of a bridge fault corresponding to the information on a pair of wiring lines. The calculated weighted bridge fault coverage W_BFC is stored in the fault coverage information area 209. In addition, the calculation module 13 calculates the weight of a non-detected fault and stores the weight in the fault coverage information area 209 in the order of weight.

In step S70, the bridge fault test pattern stored in the test pattern area 207 of the fault coverage calculating apparatus 1 shown in FIG. 1 is transmitted to the tester 2 through the output device 40. The tester 2 performs a bridge fault test on a manufactured target LSI by using the received bridge fault test pattern. That is, the bridge fault test pattern whose weighted bridge fault coverage W_BFC is calculated makes it possible to perform a bridge fault test capable of guaranteeing a test quality. Therefore, when the weighted bridge fault coverage W_BFC does not satisfy a desired coverage, the weighted bridge fault coverage W_BFC is (should be) improved and then the bridge fault test is performed on a target LSI. Alternatively, another bridge fault test pattern is used to perform the bridge fault test on a target LSI.

According to the fault coverage calculating apparatus 1 of this embodiment, the lengths of adjacent wiring lines in the sections SE1 to SEn, corresponding to the bridge faults being not detected, are extracted from a pair of adjacent wiring lines. For example, the weight WT of the pair P2 of adjacent wiring lines shown in FIG. 7 is calculated by the following Expression 16:

$$WT = \Sigma\{fi \times (DLi + \Delta DLi)\} \quad \text{[Expression 16]}$$
$$= f1 \times (L5 + \Delta L5 + L8 + \Delta L8) + f2 \times (L6 + \Delta L6) + f3 \times (L7 + \Delta L7).$$

When there are pairs of adjacent wiring lines corresponding to non-detected bridge faults, to add a bridge fault test pattern for preferably detecting bridge faults with larger weight WT among the non-detected bridge faults, makes it possible to effectively improve the weighted bridge fault coverage W_BFC.

In FIG. 3, the close distance D is divided into three sections SE1 to SE3, and the average bridge fault incidences f1 to f3 are used to calculate the weighted bridge fault coverage W_BFC. However, the close distance D may be divided into two sections or four or more sections other than three sections. The number of divided sections is determined by the dependence of the bridge fault incidence with respect to the distance between wiring lines. That is, the close distance D is divided into a plurality of sections such that the greater the dependence of the bridge fault incidence with respect to the distance between wiring lines becomes, the lower the ratio of the divided distance d to the close distance D becomes.

When a target LSI has a multi-layer wiring line, information on each pair of adjacent wiring lines is extracted from every wiring layer, and then the weighted bridge fault coverage W_BFC is calculated. When the bridge fault incidences are different from each other in the wiring layers, different bridge fault incidences are set to the wiring layers, and then the weighted bridge fault coverage W_BFC is calculated.

As described above, according to the fault coverage calculating apparatus shown in FIG. 1, the weighted bridge fault coverage W_BFC of a bridge fault test pattern to which the length of adjacent wiring lines and the bridge fault incidence depending on the distance DL between a pair of adjacent wiring lines is weighted is calculated. That is, it is possible to evaluate the quality of a bridge fault test considering the layout information. Therefore, the bridge fault test whose test quality has been exactly evaluated can be applied to a manufactured target LSI. As a result, for example, a bridge fault test pattern having a high weighted bridge fault coverage W_BFC is applied to a target LSI, which makes it possible to accurately detect bridge faults and estimate defect level related to bridge fault left undetected. In addition, it be comes easier to locate the place of the bridge fault on the basis of the detection result, which makes it possible to consider an effective measure to reduce the occurrence of bridge faults.

Second Embodiment

Figure 11:
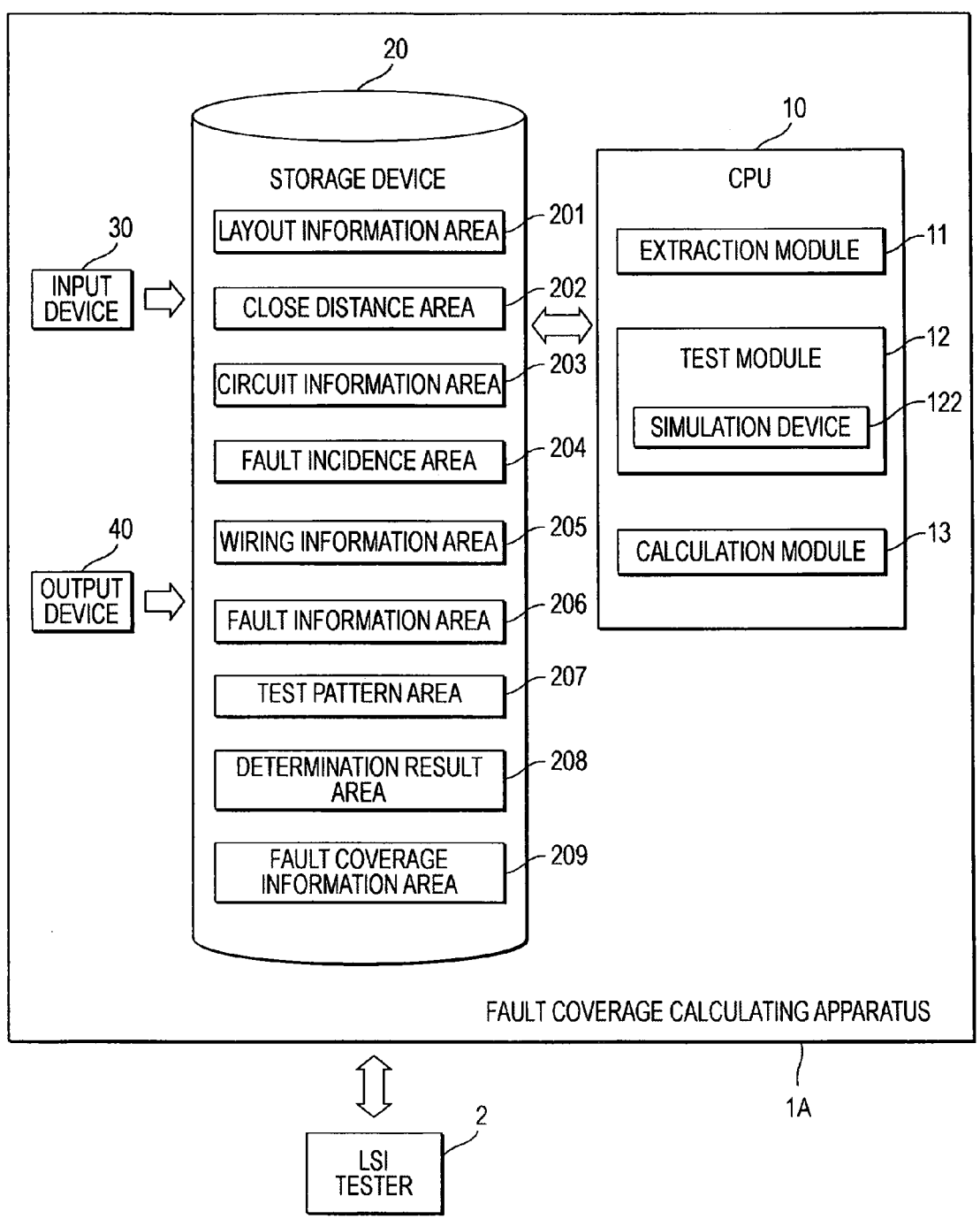
FIG. 11 is an exemplary diagram schematically illustrating the structure of a fault coverage calculating apparatus according to a second embodiment of the invention.

As shown in FIG. 11, a fault coverage calculating apparatus 1A according to a second embodiment of the invention differs from the fault coverage calculating apparatus 1 shown in FIG. 1 in that a test module 12 includes a simulation device 122 instead of the ATPG 121. In this embodiment, the other components are the same as those in the first embodiment shown in FIG. 1.

In the fault coverage calculating apparatus 1 shown in FIG. 1, the ATPG 121 generates a bridge fault test pattern, and the test module 12 uses the generated bridge fault test pattern to perform a bridge fault detection test for detecting a bridge fault from a pair of adjacent wiring lines.

Meanwhile, in the fault coverage calculating apparatus 1A shown in FIG. 11, the test module 12 uses a bridge fault test pattern generated beforehand to perform a bridge fault test (simulation) for detecting a bridge fault from a pair of adjacent wiring lines. That is, the fault coverage calculating apparatus 1A calculates a bridge fault coverage of the bridge fault test pattern generated beforehand. A method of calculating the fault coverage of the bridge fault test pattern and using the bridge fault test pattern whose fault coverage has already been calculated to perform a bridge fault test (simulation) on a target LSI by using the fault coverage calculating apparatus 1A shown in FIG. 11 will be described below with reference to a flow chart shown in FIG. 12.

Figure 10:
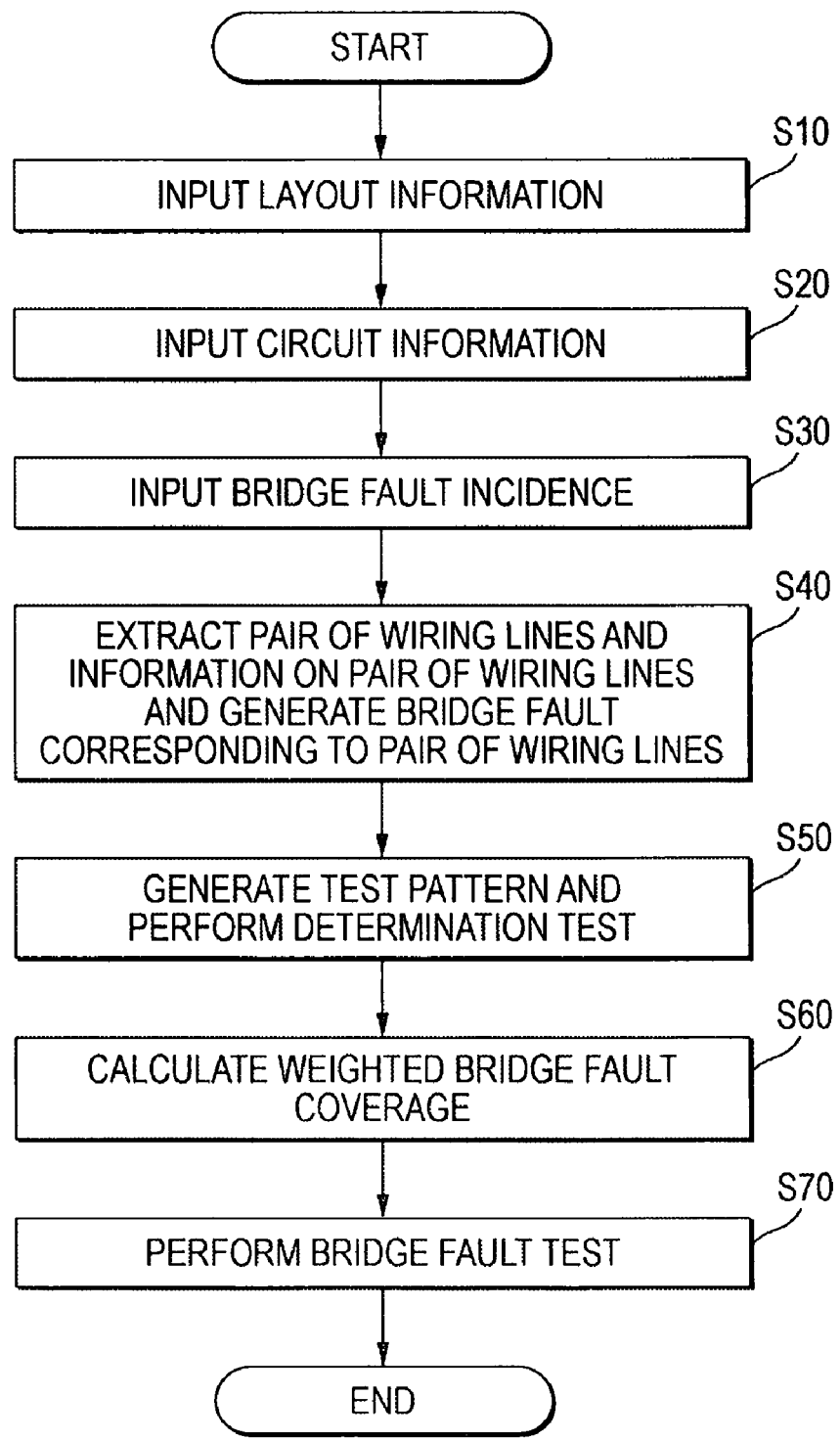
FIG. 10 is an exemplary flow chart illustrating the fault coverage calculating method according to the first embodiment.

In steps S10 to S30, layout information of a target LSI, a close distance D, circuit information of the target LSI associated with the layout information, and a bridge fault incidence depending on the distance DL between the wiring lines are stored in a layout information area 201, a close distance area 202, a circuit information area 203, and a fault incidence area 204, respectively, by the same method as described in steps S10 to S30 of the flow chart shown in FIG. 10.

In step S35, the bridge fault test pattern generated beforehand is stored in a test pattern area 207 through an input device 30. When a pair of wiring lines and a bridge fault have already been defined and a bridge fault has been detected by the ATPG, the bridge fault test pattern is stored in a wiring information area 205, a fault information area 206, and a determination result (detection information) area 208 through the input device 30.

When the pair of wiring lines and the bridge fault are not obtained in step S35, an extraction module 11 extracts a pair of adjacent wiring lines and information on the pair of adjacent wiring lines from the layout information in step S40 by the same method as described in step S40 of the flow chart shown in FIG. 10. The extraction module 11 also extracts related information of a basic cell for driving each signal of the pair of wiring lines, generates a bridge fault corresponding to each pair of wiring lines, and stores the generated bridge fault in the fault information area 206.

In step S55, the test module 12 shown in FIG. 11 reads out the bridge fault from the fault information area 206. The test module 12 also reads out the circuit information and the bridge fault test pattern from the circuit information area 203 and the test pattern area 207, respectively. The test module 12 performs a bridge fault simulation as a determination test for determining whether a bridge fault corresponding to a pair of adjacent wiring lines is detected by the bridge fault test pattern. More specifically, the simulation device 122 applies the bridge fault test pattern to a circuit of the target LSI included in the circuit information to perform fault simulation on the target LSI. The fault simulation makes it possible to determine whether the bridge fault occurring in each pair of wiring line included in the circuit information is detected. Since the circuit information and the layout information are associated with each other, it is determined whether the bridge fault occurring in a pair of adjacent wiring lines extracted from the layout information is detected. The result (detection information) determined by the fault simulation (determination test) is stored in the determination result area 208.

Figure 12:
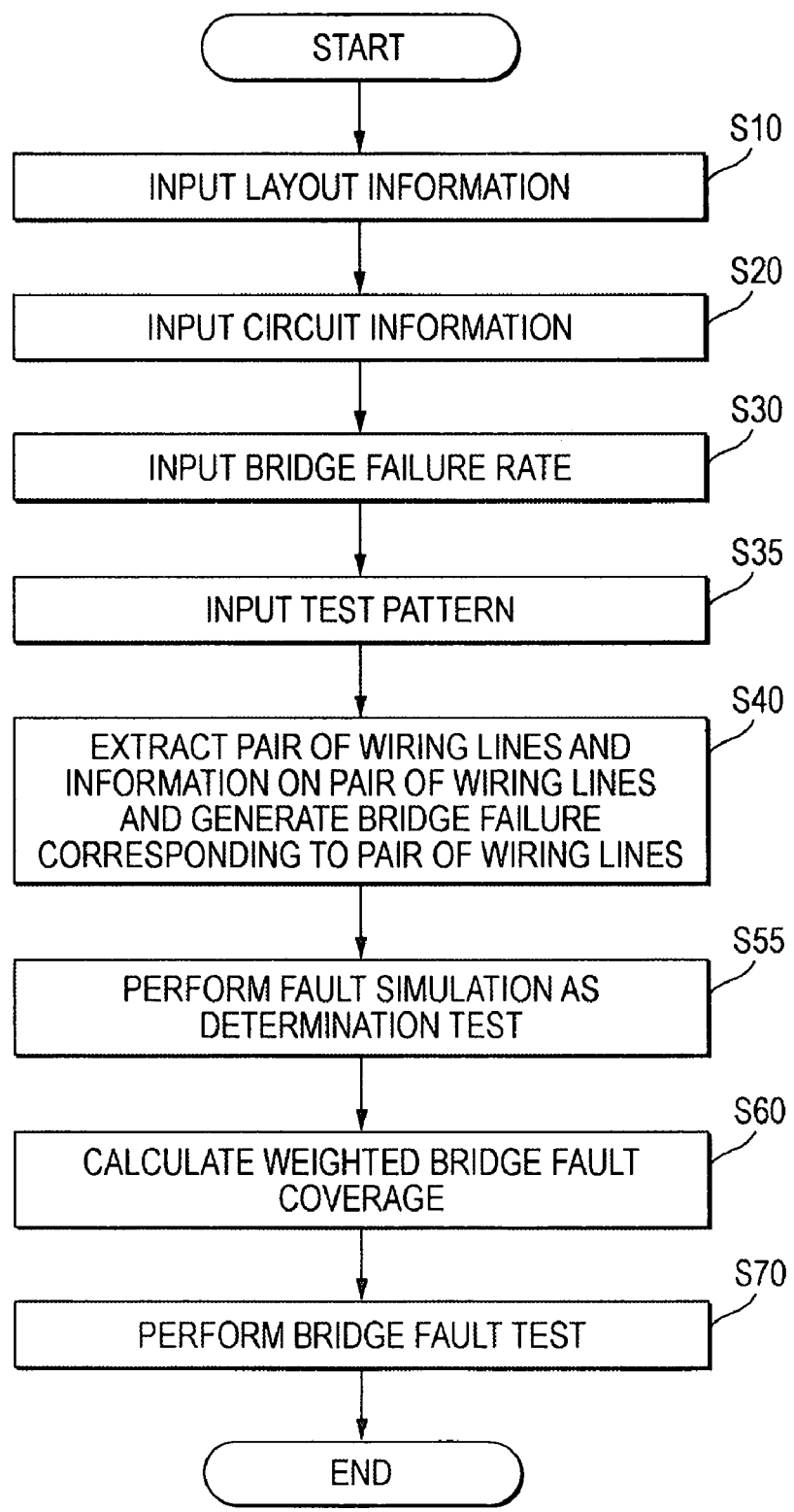
FIG. 12 is an exemplary flow chart illustrating a fault coverage calculating method according to the second embodiment.

In step S60 shown in FIG. 12, the weighted bridge fault coverage W_BFC is calculated by the same method as described in step S60 of the flow chart shown in FIG. 10. In addition, the calculation module 13 calculates the weight of a non-detected fault and stores the weight in the fault coverage information area 209 in the order of weight. In step S70 shown in FIG. 12, the bridge fault test pattern transmitted from the test pattern area 207 shown in FIG. 11 is used to test the bridge faults of the target LSI manufactured in the tester 2.

According to the fault coverage calculating apparatus 1A shown in FIG. 11, the bridge fault test using the bridge fault test pattern generated beforehand is performed to the weight of a non-detected fault and the weighted bridge fault coverage W_BFC. In this embodiment, a description of the same structure and components as those in the first embodiment will be omitted.

Third Embodiment

Figure 13:
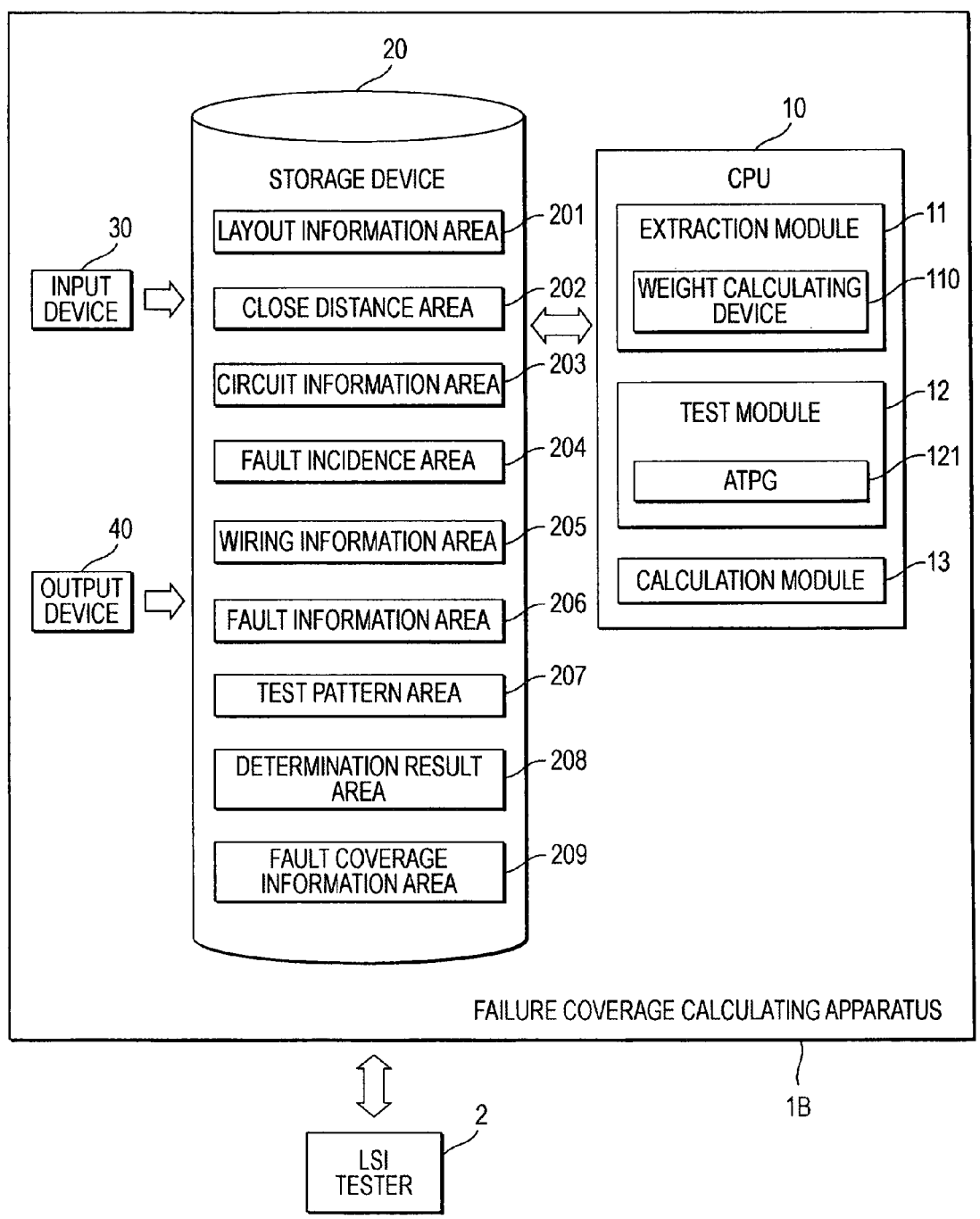
FIG. 13 is an exemplary diagram schematically illustrating the structure of a fault coverage calculating apparatus according to a third embodiment of the invention.

As shown in FIG. 13, a fault coverage calculating apparatus 1B according to a third embodiment of the invention differs from the fault coverage calculating apparatus 1 shown in FIG. 1 in that an extraction module 11 includes a weight calculating device 110 that calculates a weight WT of a pair of adjacent wiring lines, which is the product of the length of adjacent wiring lines and a bridge fault incidence. In this embodiment, the other components are the same as those in the first embodiment shown in FIG. 1.

The weight calculating device 110 has a function for calculating a bridge fault incidence f(D) depending on a close distance D stored therein, and uses the function to calculate the weight WT of a pair of adjacent wiring lines.

Figure 14:
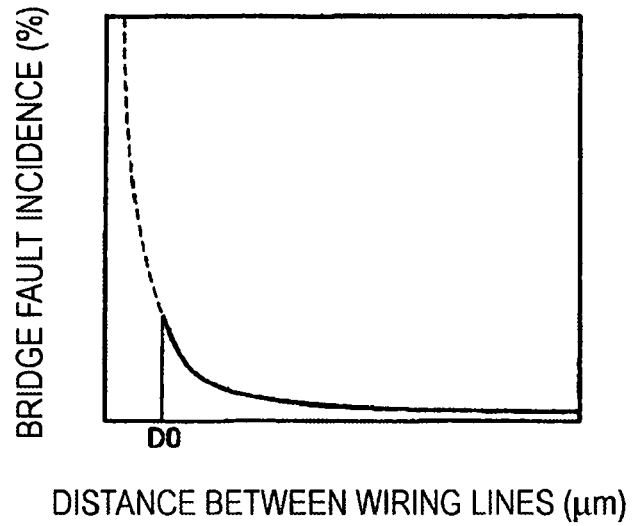
FIG. 14 is an exemplary graph illustrating the relationship between a bridge fault incidence and the distance between wiring lines.

In general, the bridge fault incidence depends on the size of dust and the distance between wiring lines of an LSI. FIG. 14 shows a bridge fault incidence due to dust generating in an LSI manufacturing line. In FIG. 14, the horizontal axis indicates the distance between wiring lines. As shown in FIG. 14, when the distance between wiring lines is smaller than a minimum distance D0 between the wiring lines, the bridge fault incidence due to dust is 0%. When the distance between wiring lines is larger than the minimum distance D0 between the wiring lines, generally, the bridge fault incidence varies according to the incidence rate of dust with a strong correlation therebetween. When the distance between wiring lines is 'y', the incidence incidence n(y) of dust in the LSI manufacturing line can be calculated by measuring how many times a short circuit occurs by using a wiring TEG having a plurality of wiring lines arranged at the minimum distance D0or by performing the Monte-Carlo simulation. In general, the incidence rate n(y) is reduced in proportion to $1/y^\alpha$ ($\alpha$ is a real number greater than 2). In the following description, for the purpose of a better understanding of the invention, it is regarded that dust has a circular shape on a surface on which a pair of adjacent wiring lines are arranged. Assuming that, when the diameter of dust on the surface having the pair of adjacent wiring lines arranged thereon (hereinafter, simply referred to as a 'diameter') is equal to or larger than the close distance D, the bridge fault occurs due to the dust, a bridge fault incidence f(D) is represented by the following Expression 17:

$$f(D) = \int \{n(y) \times (y-D)\} dy. \qquad \text{[Expression 17]}$$

In Expression 17, $\int dy$ means integrating the function with respect to y from D to $D_{max}$. In Expression 17, $D_{max}$ is considerably larger than the close distance D. When $n(y)=a/y^\alpha$ is substituted into Expression 17 and it is considered that $D_{max}$ is considerably larger than the close distance D, the following Expression 18 is obtained:

$$f(D) = A \times \int \{(1/y^{\alpha-1} - D/y^\alpha)\} dy, \qquad \text{[Expression 18]}$$
$$= A/\{(\alpha-1) \times (\alpha-2) \times D^{\alpha-1}\}.$$

where A is a proportional constant.

Figure 15:
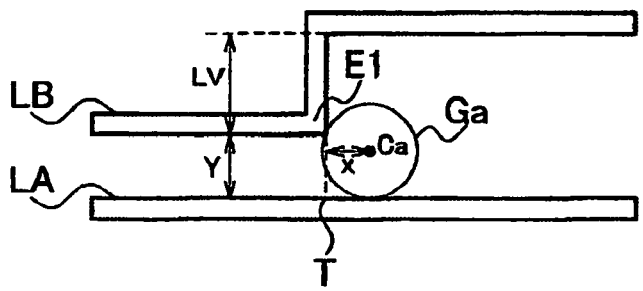
FIG. 15 is an exemplary top view illustrating an example of the layout of a pair of wiring lines.

In some cases, dust having a diameter larger than the distance between adjacent parts of a pair of wiring lines contacts end portions of the adjacent part, which causes the bridge fault. FIG. 15 shows an example in which a wiring line LA and a wiring line LB are adjacent to each other at a distance Y and the circumstance of a dust Ga having a diameter that is larger than the distance Y between the wiring lines contacts the wiring line LA and the wiring line LB. The dust Ga contacts a bent portion E1 of the wiring line LB. In the bent portion E1 of the wiring line LB, an adjacent part of the wiring line LB separated from the wiring line LA at the distance Y is connected to another adjacent part having a length LV. Since the dust Ga contacts the wiring line LA and the wiring line LB, the bridge fault due to the dust Ga occurs in the wiring lines LA and LB.

The minimum diameter dA of the dust Ga which is shown in FIG. 15, causing the bridge fault in the wiring lines LA and LB is examined below. Here, the distance from a segment linking the bent portion E1 to a point T of the wiring line LA corresponding to the bent portion E1 to the center Ca of the dust Ga in a direction in which the wiring line LA extends is referred to as a distance x. The following two cases are considered corresponding to the distance Y between the wiring lines and the length LV of the adjacent part. In both cases, the maximum value of the minimum diameter dA is Y+LV.

(A) In case of LV<Y

The maximum value of the distance x in the range affected by the close distance D is $(2 \times Y \times LV)^{1/2}$. Therefore, the following Expression 19 is established:

$$(dA/2)^2 = x^2 + (Y - dA/2)^2. \quad \text{[Expression 19]}$$

The minimum diameter dA of the dust Ga causing the bridge fault in the wiring lines LA and LB is obtained by the following Expression 20:

$$dA = Y \times \{1 + (x/Y)^2\}. \quad \text{[Expression 20]}$$

(B) In case of LV≧Y

The maximum value of the distance x in the range affected by the close distance D is (Y+LV)/2. The minimum diameter dA of the dust Ga is obtained by the following Expressions 21 and 22:

(I) In case of 0<x<D:

$$dA = Y \times \{1 + (x/Y)^2\}. \quad \text{[Expression 21]}$$

(II) In case of D≦x≦(Y+LV)/2:

$$dA = 2 \times x. \quad \text{[Expression 22]}$$

Figure 16:
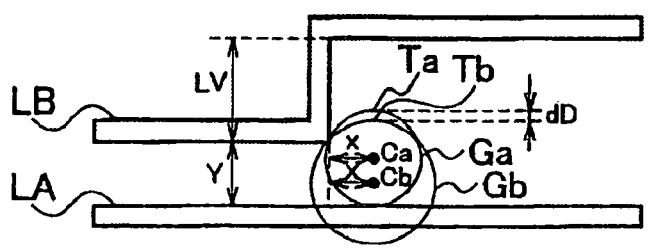
FIG. 16 is an exemplary top view illustrating an example of the layout of a pair of wiring lines.

By the way, when x>0, the bridge fault incidence f(D) may be different from the bridge fault incidence obtained by Expression 18. For example, similar to the dust Ga, when the distance from a segment linking the bent portion E1 to a point T of the wiring line LA corresponding to the bent portion E1 to the center Cb of a dust Gb shown in FIG. 16 in a direction in which the wiring line LA extends is referred to as a distance x and the diameter dB of the dust Gb is larger than a maximum diameter dA, a vertex Tb of the dust Gb is closer to the wiring line LA than a vertex Ta of the dust Ga, which causes the bridge fault incidence f(D) to be different from that obtained by Expression 18. Here, the term 'vertex' means a point on the circumference of the dust Ga or the dust Gb that is furthest away from the wiring line LA. More specifically, the difference dD between the distance from the wiring line LA to the vertex Ta of the dust Ga and the distance from the wiring line LA to the vertex Tb of the dust Gb is obtained by the following Expression 23:

$$dD = [dA/2 - \{(dA/2)^2 - x^2\}^{1/2}] - [dB/2 - \{(dB/2)^2 - x^2\}^{1/2}] \quad \text{[Expression 23]}$$

As the diameter dB becomes larger, the difference dD becomes larger. However, generally, as the diameter dB becomes larger, the incidence rate of dust is rapidly lowered. Therefore, the error of the bridge fault incidence f(D) represented in Expression 18, which is caused by the dust Gb having the diameter dB, has little influence on the accuracy of the bridge fault coverage. Thus, it is possible to use Expression 18 to calculate the bridge fault incidence f(D) when wiring lines are arranged at the close distance D.

Figure 17:
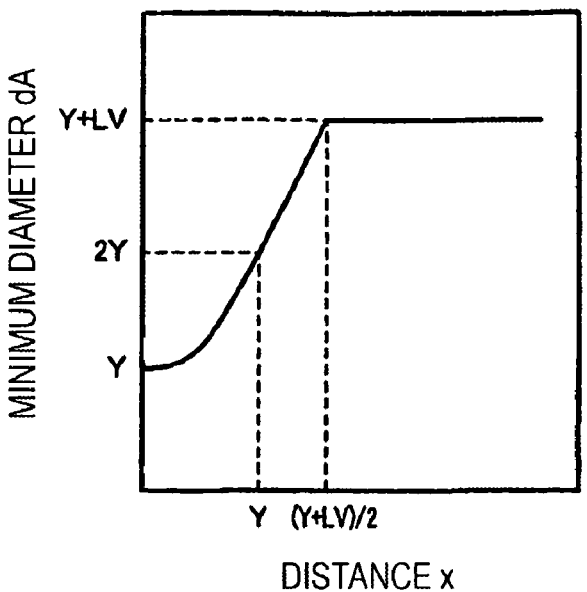
FIG. 17 is an exemplary graph illustrating the relationship between the minimum diameter of dust causing a bridge fault and the position of dust.

FIG. 17 shows a graph plotting the minimum diameter dA with respect to the distance x in the case of (B). From the graph shown in FIG. 17, the minimum diameter dA is approximate to that represented by the following Expression 24 in case of x≦Y/2, and the minimum diameter dA is approximate to that represented by the following Expression 25 in case of Y/2≦x≦(Y+LV)/2:

$$dA = Y, \text{ and} \quad \text{[Expression 24]}$$

$$dA = 2 \times x. \quad \text{[Expression 25]}$$

Figure 18:
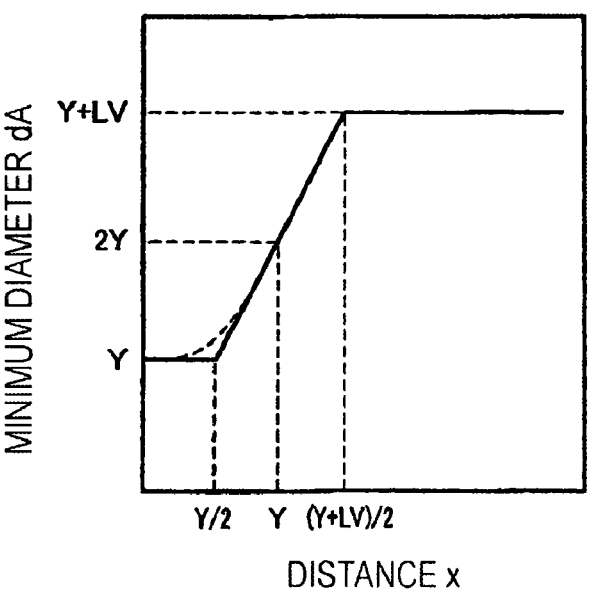
FIG. 18 is an exemplary graph illustrating the relationship between the minimum diameter of dust causing a bridge fault and the position of dust.

FIG. 18 shows a graph plotting the approximate minimum diameter dA obtained by Expressions 24 and 25 with respect to the distance x. In FIG. 18, the minimum diameter dA of FIG. 17 that is represented by a dashed line superposes the approximate minimum diameter dA obtained by Expressions 24 and 25 with only a slight deviation. Therefore, even when the approximate minimum diameter dA obtained by Expressions 24 and 25 is used, the accuracy of the bridge fault coverage is little affected. The weighted bridge fault coverage W_BFC corresponding to the bridge fault incidence f(D) in the case of Y/2<x≦(Y+LV)/2, which is represented in Expression 18, is obtained by the following Expression 26:

$$W\_BFC = \int f(2x)dx$$
$$= A / \{(\alpha - 1) \times (\alpha - 2)\} \times \int (2x)^{\alpha-1} dx.$$

In Expression 26, ∫dx means integrating the function with respect to x from Y/2 to (Y+LV)/2.

Figure 19:
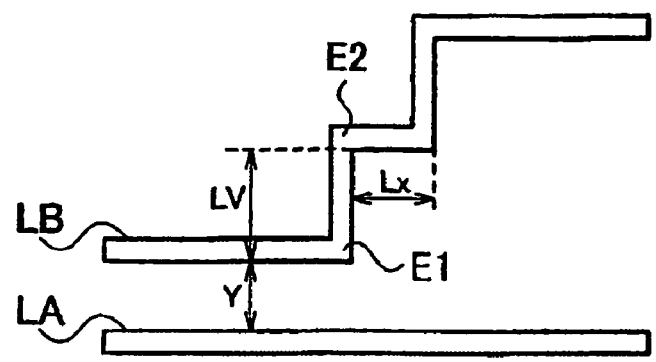
FIG. 19 is an exemplary top view illustrating an example of the layout of a pair of wiring lines.

As shown in FIG. 19, in the actual layout of an LSI, the wiring line LB has a series of bent portions connected to one another. In FIG. 19, a first adjacent part of the wiring line LB that is separated from the wiring line LA by a distance Y is connected to a second adjacent part having a length LV in a bent portion E1, and the second adjacent part having the length LV is connected to a third adjacent part having a length Lx in a bent portion E2. As described above, when Expression 26 is applied to the bent portions E1 and E2 of the wiring line LB shown in FIG. 19 to calculate the accuracy of the weighted bridge fault coverage W_BFC, it takes a lot of time to calculate the accuracy of the weighted bridge fault coverage W_BFC, but the accuracy of the weighted bridge fault coverage W_BFC is not improved. In this case, for example, it is possible to reduce the time required to calculate the weighted bridge fault coverage W_BFC by calculating the bridge fault rate f(D) as follows. That is, in the case of Lx≦Y/2, Expression 24 is used to calculate the bridge fault incidence f(D) of the adjacent part having the length Lx, and in the case of Lx≦(Y+LV)/2, Expressions 24 and 25 are used to calculate the bridge fault incidence f(D) of the adjacent part having the length Lx.

Figure 20:
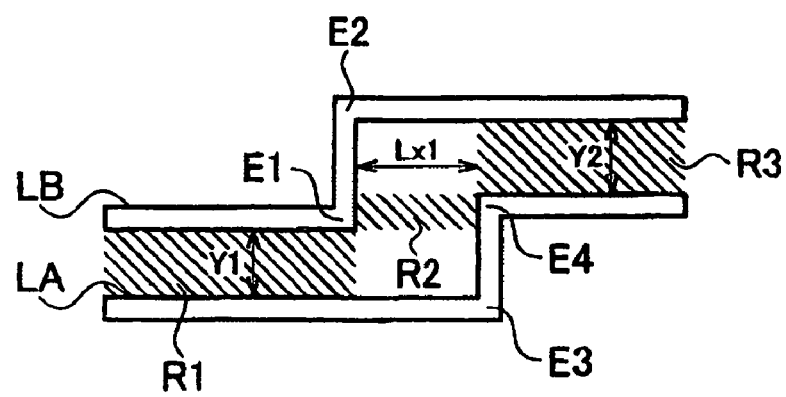
FIG. 20 is an exemplary top view illustrating an example of the layout of a pair of wiring lines.

In some cases, a pair of wiring lines are adjacent parallel to each other before and after the bent portion of the wiring line. For example, the layout of an LSI shown in FIG. 20 includes a region R1 in which a wiring line LA and a wiring line LB are adjacent to each other at a distance Y1 and a region R3 in which the wiring line LA and the wiring line LB are adjacent to each other at a distance Y2. In addition, the layout includes a region R2 in which a portion of an adjacent part between a bent portion E1 and a bent portion E2 of the wiring line LB is adjacent to a portion of an adjacent part between a bent portion E3 and a bent portion E4 of the wiring line LA at a distance Lx1. In FIG. 20, the regions R1, R2, and R3 are hatched. The above-mentioned method is used to calculate the bridge fault incidence f(D) in the regions R1, R2, and R3 considering the bent portions E1 to E4.

Next, a method of calculating a fault coverage of a bridge fault test pattern and using the bridge fault test pattern whose fault coverage has been calculated to perform a bridge fault detection test on a target LSI by using the fault coverage calculating apparatus 1B shown in FIG. 13 will be described with reference to a flow chart shown in FIG. 21.

In steps S10 and S20, layout information of a target LSI, the close distance D, and circuit information of the target LSI associated with the layout information are stored in a layout information area 201, a close distance area 202, and a circuit information area 203, respectively, by the same method as described in steps S10 and S20 of the flow chart shown in FIG. 10.

Figure 21:
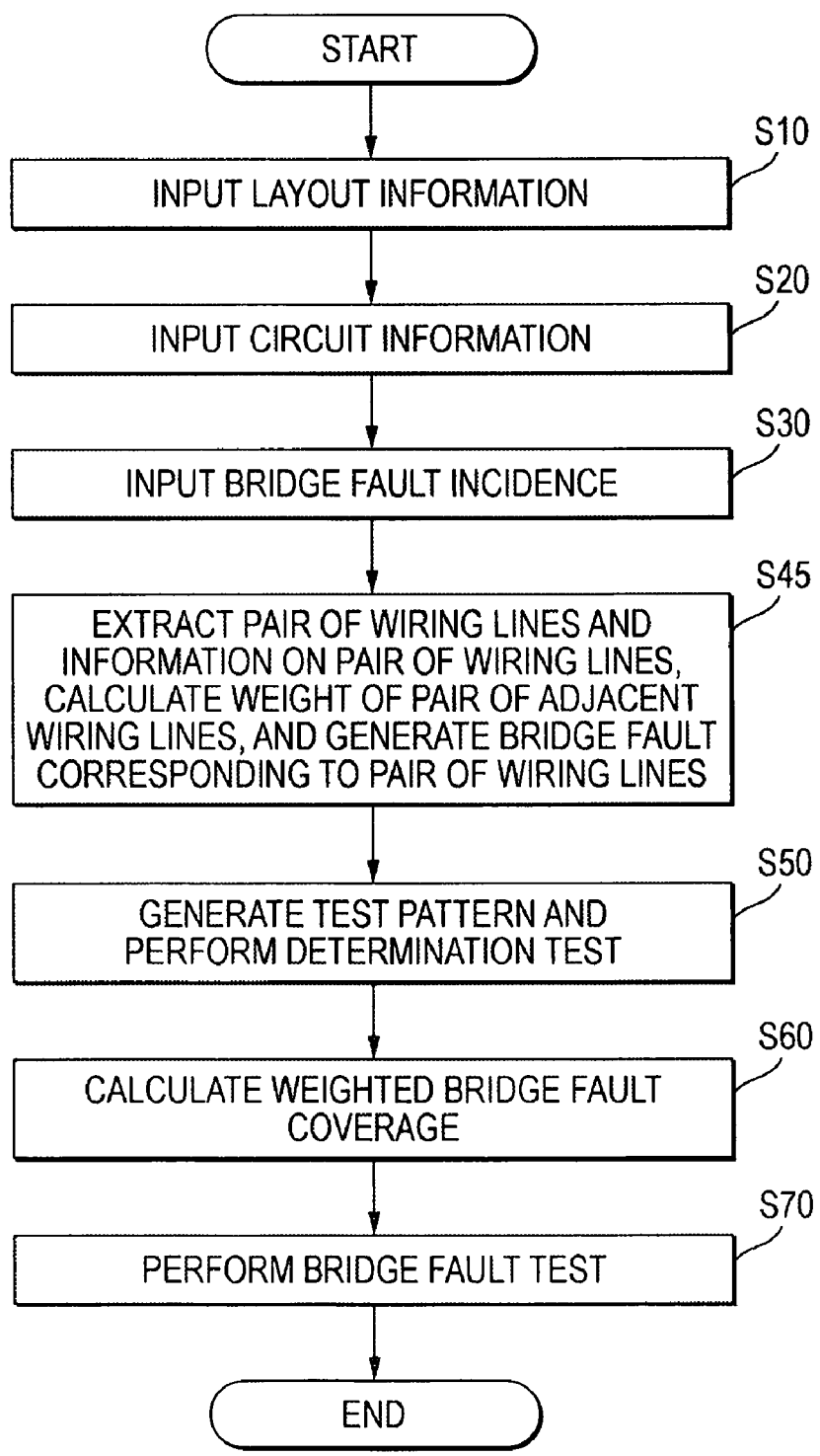
FIG. 21 is an exemplary flow chart illustrating a fault coverage calculating method according to a third embodiment of the invention.

In step S30 shown in FIG. 21, for example, a bridge fault incidence or parameters of an equation for calculating bridge fault incidences depending on the distance DL between the wiring lines shown in FIG. 14 is stored in a fault incidence area 204 through an input device 30.

In step S45, an extraction module 11 extracts a pair of adjacent wiring lines and information on the pair of adjacent wiring lines from the layout information by the same method as described in step S40 of the flow chart shown in FIG. 10. At that time, the weight calculating device 110 reads out the bridge fault incidence from the fault incidence area 204, and uses the function for calculating the bridge fault incidence f(D) that is represented by Expression 18 to calculate the bridge fault incidence of the extracted pair of adjacent wiring lines. The weight calculating device 110 uses the calculated bridge fault incidence to calculate the weight WT of the pair of adjacent wiring lines. That is, '$\Sigma(\text{fi} \times \text{DLi})$' of Expression 1 is calculated for every pair of adjacent wiring lines by the same method as that used to extract a pair of adjacent wiring lines from the layout information. The extraction module 11 also extracts related information, such as a basic cell for driving each signal of a pair of wiring lines, generates a bridge fault corresponding to each pair of wiring lines, and stores the bridge fault together with the calculated weight WT of a pair of adjacent wiring lines in the fault information area 206.

In step S50, the test module 12 generates a bridge fault test pattern and performs a determination test by the same method as described in step S50 of the flow chart shown in FIG. 10.

In step S60, a calculation module 13 uses the determination result including the information on a pair of wiring lines and information on the detection (non-detection) of a bridge fault corresponding to the weight to calculate the weighted bridge fault coverage W_BFC of the bridge fault test pattern. Since fault information includes the weight WT of a pair of adjacent wiring lines corresponding to each bridge fault, the calculation module 13 uses Expression 1 to calculate the weighted bridge fault coverage W_BFC and the weight of each non-detected fault without reading out the bridge fault incidence from the fault incidence area 204 in step S60 shown in FIG. 21.

In step S70, the tester 2 performs a bridge fault test on a manufactured target LSI by the same method as described in step S70 of the flow chart shown in FIG. 10.

In this embodiment, in step S50, the bridge fault test pattern is generated to perform the determination test. However, the fault simulation may be performed as the determination test, similar to the method described in the second embodiment. In step S30, the bridge fault incidence is stored in the fault incidence area 204. However, the weight calculating device 110 may have the bridge fault incidence stored beforehand.

As described above, in the fault coverage calculating apparatus 1B according to the third embodiment, the weight calculating device 110 uses the bridge fault incidence f(D) calculated by Expression 18 to calculate the weight WT of a bridge fault corresponding to a pair of adjacent wiring lines, and calculates the weighted bridge fault coverage W_BFC. Therefore, according to the fault coverage calculating apparatus 1B shown in FIG. 13, it is possible to calculate the weighted bridge fault coverage W_BFC to which the influence of the layout is reflected, as compared to the fault coverage calculating apparatus 1 shown in FIG. 1 that divides the distance between wiring lines and sets the bridge fault incidence. In this embodiment, a description of the same structure and components as those in the first embodiment will be omitted.

Fourth Embodiment

Figure 22:
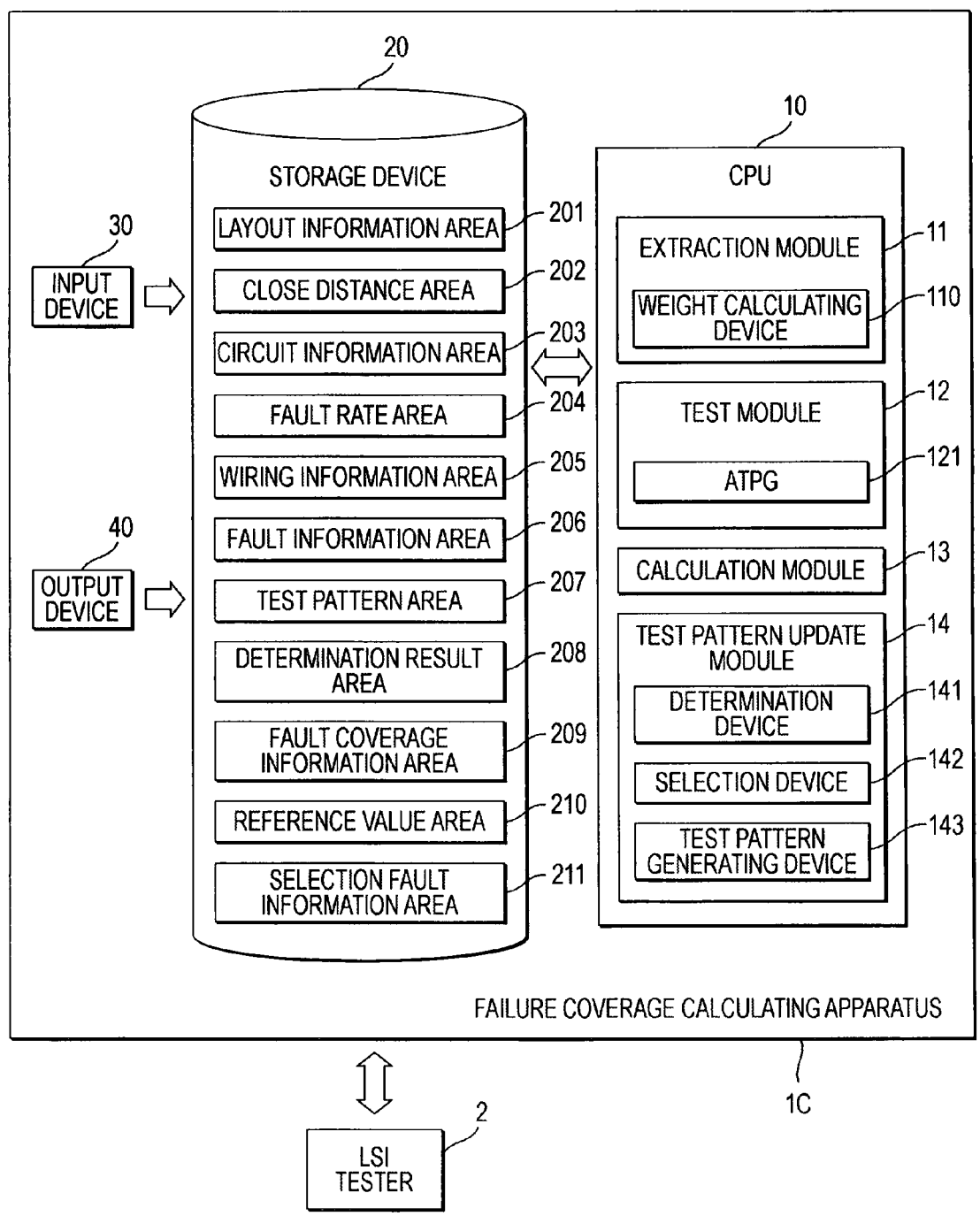
FIG. 22 is a diagram schematically illustrating the structure of a fault coverage calculating apparatus according to a fourth embodiment of the invention.

As shown in FIG. 22, a fault coverage calculating apparatus 1C according to a fourth embodiment of the invention differs from the fault coverage calculating apparatus 1B shown in FIG. 13 in that the fault coverage calculating apparatus 1C further includes at test pattern update module 14 that generates a bridge fault test pattern for detecting a pair of adjacent wiring lines from which no bridge fault is detected. In this embodiment, the other components are the same as those in the third embodiment shown in FIG. 13. In the following description, the pair of adjacent wiring lines from which no bridge fault is detected in a determination test is referred to as a 'non-detected pair of adjacent wiring lines'.

The test pattern update module 14 includes a determination device 141, a selection device 142, and a test pattern generating device 143. The determination device 141 determines whether a weighted bridge fault coverage W_BFC satisfies a predetermined reference value. When a plurality of non-detected pairs of adjacent wiring lines exist, the selection device 142 prioritizes the non-detected pairs of adjacent wiring lines and selects a non-detected pair of adjacent wiring lines from the plurality of non-detected pairs of adjacent wiring lines. As described above, the fault coverage calculating apparatus 1C calculates the weights WT of all the pairs of adjacent wiring lines extracted from layout information. That is, the fault coverage calculating apparatus 1C also calculates the weights WT of the non-detected pairs of adjacent wiring lines. The selection device 142 selects a set of non-detected pairs of adjacent wiring lines having the largest weight WT. The test pattern generating device 143 generates an additional test pattern for detecting a bridge fault from the selected non-detected pair of adjacent wiring lines.

Figure 23:
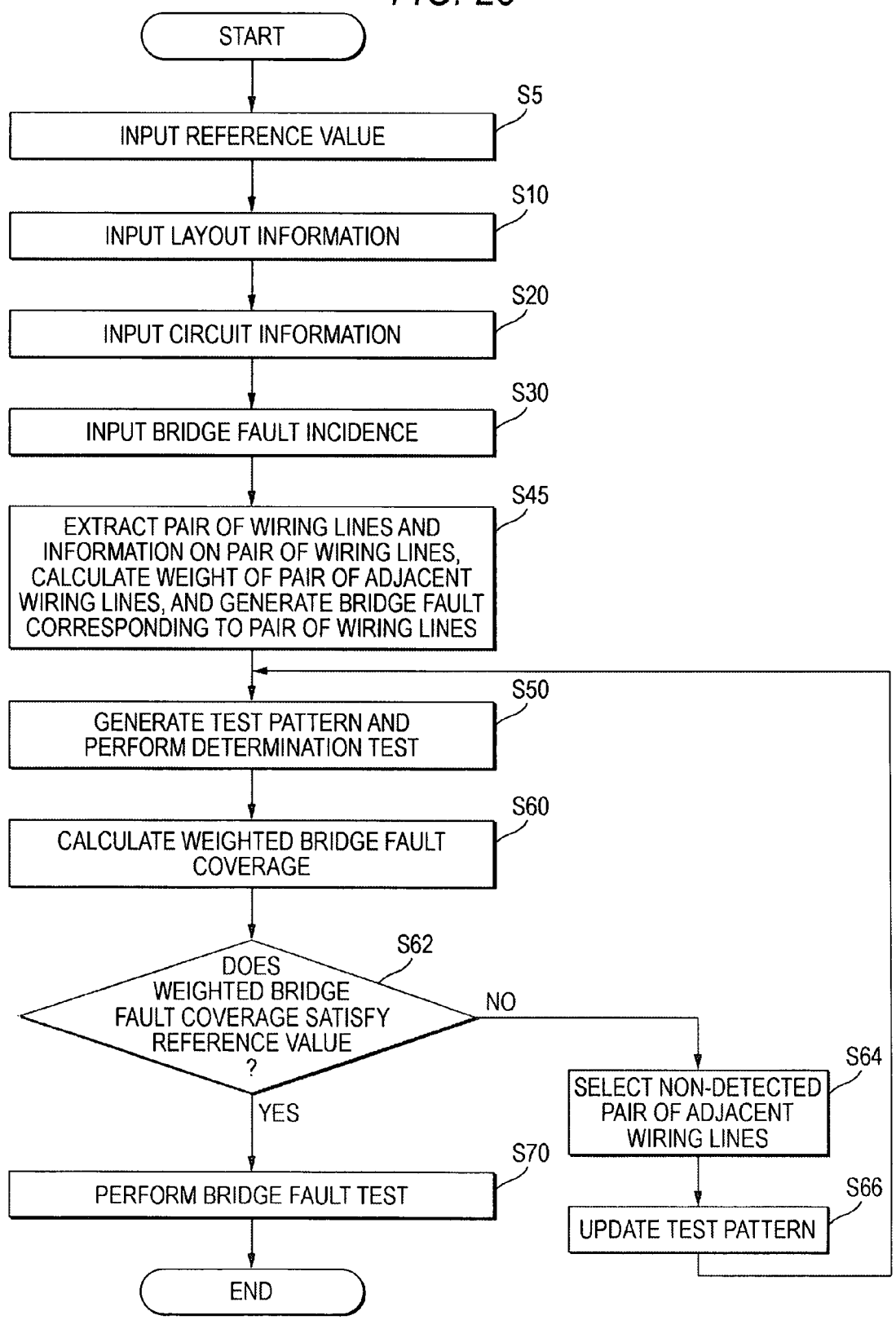
FIG. 23 is a flow chart illustrating a fault coverage calculating method according to the fourth embodiment.

Next, a method of calculating the fault coverage of a bridge fault test pattern and using the bridge fault test pattern whose fault coverage has been calculated to perform a bridge fault detection test on a target LSI by using the fault coverage calculating apparatus 1C shown in FIG. 22 will be described with reference to a flow chart shown in FIG. 23.

In step S5, a predetermined reference value is stored in a reference value area 210 through an input device 30.

In steps S10 to S60, the weighted bridge fault coverage W_BFC of the bridge fault test pattern is calculated by the same method as described in steps S10 to S60 of the flow chart shown in FIG. 21. That is, a pair of adjacent wiring lines, information on the pair of adjacent wiring lines, and a bridge fault corresponding to the pair of adjacent wiring lines are extracted, and simultaneously, the weight WT of the pair of adjacent wiring lines is calculated. The calculated weight WT of the pair of adjacent wiring lines is stored in a wiring information area 205 as a portion of the information on the pair of adjacent wiring lines. Then, it is determined whether the pair of adjacent wiring lines are detected by the bridge fault test pattern of the target LSI. In addition, the weighted bridge fault coverage W_BFC of the bridge fault test pattern is calculated on the basis of the information on the pair of adjacent wiring lines and the determination result.

In step S62, the determination device 141 reads out the weighted bridge fault coverage W_BFC and the reference value from a fault coverage information area 209 and the reference value area 210, respectively. The determination device 141 determines whether the weighted bridge fault coverage W_BFC satisfies the reference value. When the weighted bridge fault coverage W_BFC satisfies the reference value, the process proceeds to step S70. On the other hand, when the weighted bridge fault coverage W_BFC does not satisfy the reference value, the process proceeds to step S64.

In step S64, the selection device 142 reads out the weight WT of the pair of adjacent wiring lines and the result (detection information) determined by the determination test from the wiring information area 205 and a determination result area 208, respectively. The selection device 142 prioritizes bridge faults corresponding to non-detected pairs of adjacent wiring lines on the basis of the weight WT and selects a non-detected pair of adjacent wiring lines having the largest weight WT. Then, information on the selected non-detected pair of adjacent wiring lines and a bridge fault corresponding to the selected non-detected pair of adjacent wiring lines are stored in a selection fault information area 211.

In step S66, the test pattern generating device 143 reads out circuit information and bridge fault information of the non-detected pair of adjacent wiring lines from a circuit information area 203 and the selection fault information area 211, respectively. The test pattern generating device 143 uses the circuit information and the bridge fault information of the non-detected pair of adjacent wiring lines to generate an additional test pattern for detecting a bridge fault from the selected non-detected pair of adjacent wiring lines. The test pattern generating device 143 adds the generated additional test pattern to the bridge fault test pattern stored in a test pattern area 207 to update the bridge fault test pattern. Then, the process returns to step S50 to perform a test for determining the updated bridge fault test pattern and to calculate the weighted bridge fault coverage W_BFC. The determination device 141 determines whether the bridge fault coverage of the bridge fault test pattern having the additional test pattern added thereto satisfies the reference value. In steps S50 to S66, the update of the bridge fault test pattern and the calculation of the weighted bridge fault coverage W_BFC are repeated until the weighted bridge fault coverage W_BFC satisfies the reference value.

In step S70, the bridge fault test pattern stored in the test pattern area 207 is propagated to a tester 2 through an output device 40. The tester 2 performs a bridge fault detection test on a manufactured target LSI on the basis of the received bridge fault test pattern.

In this embodiment, the non-detected pairs of adjacent wiring lines are selected one by one. However, a plurality of non-detected pairs of adjacent wiring lines may be selected in descending order of weight WT such that the total sum of weights of detectable pairs of adjacent wiring lines is larger than a prescribed value, and an additional test pattern for detecting bridge faults corresponding to all the selected non-detected pairs of adjacent wiring lines may be generated. For example, the prescribed value may be set to 80% of the total sum of weights WT of all pairs of adjacent wiring lines included in a target LSI.

As described above, according to the fault coverage calculating apparatus-1C of the fourth embodiment of the invention, it is possible to improve the weighted bridge fault coverage W_BFC by adding an additional test pattern for detecting a bridge fault from a non-detected pair of adjacent wiring lines. In this embodiment, a description of the same structure and components as those in the second embodiment will be omitted.

Other Embodiments

The invention is not limited to the above-described first to fourth embodiments and the drawings. It should be understood by those skilled in the art that various modifications and changes of the invention can be made without departing from the scope and spirit of the invention.

In the above-described first to fourth embodiments, the method of calculating the weighted bridge fault coverage W_BFC of a bridge fault occurring in a pair of adjacent wiring lines arranged in the same wiring layer has been described. However, the weight bridge fault coverage W_BFC of a bridge fault occurring in wiring lines arranged in different wiring layers may be calculated by using bridge fault incidences of the wiring lines arranged in different wiring layers.

It goes without saying that the invention can include various embodiments described in the specifications. Therefore, the technical scope of the invention is defined by only the appended claims of the invention.

According to the above-embodiments it is possible to provide a fault coverage calculating apparatus capable of accurately calculating a fault coverage of a bridge fault test pattern of a semiconductor integrated circuit, a method of calculating a fault coverage, and a method of detecting a fault.

[FIG. 1]
1: FAILURE COVERAGE CALCULATING APPARATUS
2: LSI TESTER
11: EXTRACTION MODULE
12: TEST MODULE
13: CALCULATION MODULE
20: STORAGE DEVICE
201: LAYOUT INFORMATION AREA
202: CLOSE DISTANCE AREA
203: CIRCUIT INFORMATION AREA
204: FAULT INCIDENCE AREA
205: WIRING INFORMATION AREA
206: FAULT INFORMATION AREA
207: TEST PATTERN AREA
208: DETERMINATION RESULT AREA
209: FAULT COVERAGE INFORMATION AREA
30: INPUT DEVICE
40: OUTPUT DEVICE

[FIG. 2]
101: FIRST DRIVING CIRCUIT
102: SECOND DRIVING CIRCUIT
103: FIRST RECEIVING CIRCUIT
104: SECOND RECEIVING CIRCUIT
105: THIRD RECEIVING CIRCUIT

[FIG. 4]
a. DISTANCE BETWEEN WIRING LINES
b. SECTION SE1
c. SECTION SE2
d. SECTION SE3
e. INFORMATION ON A PAIR OF WIRING LINES CORRESPONDING TO BRIDGE FAULT

[FIG. 5]
a. DISTANCE BETWEEN WIRING LINES
b. SECTION SE1
c. SECTION SE2
d. SECTION SE3
e. INFORMATION ON A PAIR OF WIRING LINES CORRESPONDING TO BRIDGE FAULT

[FIG. 6]
a. DISTANCE BETWEEN WIRING LINES
b. SECTION SE1
c. SECTION SE2
d. SECTION SE3
e. INFORMATION ON A PAIR OF WIRING LINES CORRESPONDING TO BRIDGE FAULT

[FIG. 7]
   a. INFORMATION ON A PAIR OF WIRING LINES CORRESPONDING TO BRIDGE FAULT
   b. SECTION
   c. AVERAGE BRIDGE FAULT INCIDENCE
   d. INFORMATION ON A PAIR OF WIRING LINES
   e. DETERMINATION
[FIG. 10]
   a. START
   S10: INPUT LAYOUT INFORMATION
   S20: INPUT CIRCUIT INFORMATION
   S30: INPUT BRIDGE FAULT INCIDENCE
   S40: EXTRACT A PAIR OF WIRING LINES AND INFORMATION ON A PAIR OF WIRING LINES AND GENERATE BRIDGE FAULT CORRESPONDING TO A PAIR OF WIRING LINES
   S50: GENERATE TEST PATTERN AND PERFORM DETERMINATION TEST
   S60: CALCULATE WEIGHTED BRIDGE FAULT COVERAGE
   S70: PERFORM BRIDGE FAULT TEST
   b. END
[FIG. 11]
   1A: FAULT COVERAGE CALCULATING APPARATUS
   2: LSI TESTER
   11: EXTRACTION MODULE
   12: TEST MODULE
   122: SIMULATION DEVICE
   13: CALCULATION MODULE
   20: STORAGE DEVICE
   201: LAYOUT INFORMATION AREA
   202: CLOSE DISTANCE AREA
   203: CIRCUIT INFORMATION AREA
   204: FAULT INCIDENCE AREA
   205: WIRING INFORMATION AREA
   206: FAULT INFORMATION AREA
   207: TEST PATTERN AREA
   208: DETERMINATION RESULT AREA
   209: FAULT COVERAGE INFORMATION AREA
   30: INPUT DEVICE
   40: OUTPUT DEVICE
[FIG. 12]
   a. START
   S10: INPUT LAYOUT INFORMATION
   S20: INPUT CIRCUIT INFORMATION
   S30: INPUT BRIDGE FAILURE RATE
   S35: INPUT TEST PATTERN
   S40: EXTRACT A PAIR OF WIRING LINES AND INFORMATION ON A PAIR OF WIRING LINES AND GENERATE BRIDGE FAILURE CORRESPONDING TO A PAIR OF WIRING LINES
   S55: PERFORM FAULT SIMULATION AS DETERMINATION TEST
   S60: CALCULATE WEIGHTED BRIDGE FAULT COVERAGE
   S70: PERFORM BRIDGE FAULT TEST
   b. END
[FIG. 13]
   1B: FAILURE COVERAGE CALCULATING APPARATUS
   2: LSI TESTER
   11: EXTRACTION MODULE
   110: WEIGHT CALCULATING DEVICE
   12: TEST MODULE
   13: CALCULATION MODULE
   20: STORAGE DEVICE
   201: LAYOUT INFORMATION AREA
   202: CLOSE DISTANCE AREA
   203: CIRCUIT INFORMATION AREA
   204: FAULT INCIDENCE AREA
   205: WIRING INFORMATION AREA
   206: FAULT INFORMATION AREA
   207: TEST PATTERN AREA
   208: DETERMINATION RESULT AREA
   209: FAULT COVERAGE INFORMATION AREA
   30: INPUT DEVICE
   40: OUTPUT DEVICE
[FIG. 14]
   a. BRIDGE FAULT INCIDENCE
   b. DISTANCE BETWEEN WIRING LINES
[FIG. 17]
   dA: MINIMUM DIAMETER
   x: DISTANCE
[FIG. 18]
   dA: MINIMUM DIAMETER
   x: DISTANCE
[FIG. 21]
   a. START
   S10: INPUT LAYOUT INFORMATION
   S20: INPUT CIRCUIT INFORMATION
   S30: INPUT BRIDGE FAULT INCIDENCE
   S45: EXTRACT A PAIR OF WIRING LINES AND INFORMATION ON A PAIR OF WIRING LINES, CALCULATE WEIGHT OF A PAIR OF ADJACENT WIRING LINES, AND GENERATE BRIDGE FAULT CORRESPONDING TO A PAIR OF WIRING LINES
   S50: GENERATE TEST PATTERN AND PERFORM DETERMINATION TEST
   S60: CALCULATE WEIGHTED BRIDGE FAULT COVERAGE
   S70: PERFORM BRIDGE FAULT TEST
   b. END
[FIG. 22]
   1C: FAILURE COVERAGE CALCULATING APPARATUS
   2: LSI TESTER
   11: EXTRACTION MODULE
   110: WEIGHT CALCULATING DEVICE
   12: TEST MODULE
   13: CALCULATION MODULE
   14: TEST PATTERN UPDATE MODULE
   141: DETERMINATION DEVICE
   142: SELECTION DEVICE
   143: TEST PATTERN GENERATING DEVICE
   20: STORAGE DEVICE
   201: LAYOUT INFORMATION AREA
   202: CLOSE DISTANCE AREA
   203: CIRCUIT INFORMATION AREA
   204: FAULT RATE AREA
   205: WIRING INFORMATION AREA
   206: FAULT INFORMATION AREA
   207: TEST PATTERN AREA
   208: DETERMINATION RESULT AREA
   209: FAULT COVERAGE INFORMATION AREA
   210: REFERENCE VALUE AREA
   211: SELECTION FAULT INFORMATION AREA
   30: INPUT DEVICE
   40: OUTPUT DEVICE
[FIG. 23]
   a. START
   S5: INPUT REFERENCE VALUE
   S10: INPUT LAYOUT INFORMATION
   S20: INPUT CIRCUIT INFORMATION

S30: INPUT BRIDGE FAULT RATE

S45: EXTRACT A PAIR OF WIRING LINES AND INFORMATION ON A PAIR OF WIRING LINES, CALCULATE WEIGHT OF A PAIR OF ADJACENT WIRING LINES, AND GENERATE BRIDGE FAULT CORRESPONDING TO A PAIR OF WIRING LINES

S50: GENERATE TEST PATTERN AND PERFORM DETERMINATION TEST

S60: CALCULATE WEIGHTED BRIDGE FAULT COVERAGE

S62: DOES WEIGHTED BRIDGE FAULT COVERAGE SATISFY REFERENCE VALUE?

S64: SELECT NON-DETECTED PAIR OF ADJACENT WIRING LINES

S66: UPDATE TEST PATTERN

S70: PERFORM BRIDGE FAULT TEST b. END

What is claimed is:

1. A fault coverage calculating apparatus comprising:
an extraction module configured to extract
wiring-line pair information indicating a length and an interval of each adjacent pair of wiring lines which fall within a first interval range where a bridge fault incidence is higher than a predetermined value and
bridge fault information respectively corresponding to the adjacent pair of wiring lines, the bridge fault information being obtained from layout information of a semiconductor integrated circuit;
a test module configured to perform a determination test for determining whether a bridge fault occurs in the adjacent pair of wiring lines by using a bridge fault test pattern of a target; and
a calculation module configured to calculate a weighted bridge fault coverage for the bridge fault test pattern by weighting each adjacent pair of wiring lines with the length and the interval thereof, based on the wiring-line pair information, the bridge fault information, a result of the determination test, and an interval-dependent bridge fault incidence.

2. The fault coverage calculating apparatus according to claim 1, wherein the bridge fault occurs between the adjacent pair of wiring lines within the first interval range.

3. The fault coverage calculating apparatus according to claim 1, wherein the first interval range is set based on a minimum pitch between the adjacent pair of wiring lines of a large-scale integration to which the bridge fault test pattern is applied.

4. The fault coverage calculating apparatus according to claim 1, wherein the bridge fault of the adjacent pair of wiring lines is a bridge fault activated therein.

5. The fault coverage calculating apparatus according to claim 1, wherein the adjacent pair of wiring lines is arranged in the same wiring layer.

6. The fault coverage calculating apparatus according to claim 1, wherein the extraction module comprises a weight calculating device configured to calculate a weight of the adjacent pair of wiring lines by using a product of the length of the wiring lines and the bridge fault incidence.

7. A calculation method of a fault coverage, comprising:
extracting, via a central processing unit (CPU), wiring-line pair information indicating a length and an interval of each adjacent pair of wiring lines which fall within a first interval range where a bridge fault incidence is higher than a predetermined value and bridge fault information respectively corresponding to the adjacent pair of wiring lines, the bridge fault information being obtained from layout information of a semiconductor integrated circuit included in a layout information area;
storing the wiring-line pair information in a wiring information area;
storing the bridge fault information in a fault information area;
performing, via a CPU, a determination test for determining whether a bridge fault occurs in the adjacent pair of wiring lines by using a bridge fault test pattern of a target;
storing a result of the determination test in a determination result area; and
calculating, via a CPU, a weighted bridge fault coverage for the bridge fault test pattern by weighting each adjacent pair of wiring lines with the length and the interval thereof, based on the wiring-line pair information, the bridge fault information, a result of the determination test including information on whether the bridge fault occurring in the adjacent pair of wiring lines is detected, and an interval-dependent bridge fault incidence which are read out from the wiring information area, the determination result area, and the fault incidence area, respectively.

8. The calculation method of a fault coverage according to claim 7, wherein a bridge fault occurs between the adjacent pair of wiring lines within the first interval range.

9. The calculation method of a fault coverage according to claim 7, wherein the first interval range is set based on a minimum pitch between the adjacent pair of wiring lines of a large-scale integration to which the bridge fault test pattern is applied.

10. The calculation method of a fault coverage according to claim 7, wherein the bridge fault of the adjacent pair of wiring lines is a bridge fault activated therein.

11. The calculation method of a fault coverage according to claim 7, further comprising:
calculating a weight of the bridge fault occurring in the adjacent pair of wiring lines by using a product of the length of the wiring lines and the bridge fault incidence.

12. The calculation method of a fault coverage according to claim 11, further comprising:
selecting a plurality of non-detected adjacent pair of wiring lines whose the bridge fault is not detected, based on the weight of the bridge fault occurring in the adjacent pair of wiring lines;
selecting a non-detected adjacent pair of wiring lines having a largest weight of the bridge fault occurring in the adjacent pair of wiring lines among the plurality of non-detected adjacent pair of wiring lines;
storing a bridge fault information corresponding to the non-detected adjacent pair of wiring lines; and
generating a bridge fault test pattern for detecting a bridge fault occurring in the non-detected adjacent pair of wiring lines having the largest weight of the bridge fault by using a circuit information of the non-detected adjacent pair of wiring lines and the bridge fault information corresponding to the non-detected adjacent pair of wiring lines.

13. The calculation method of a fault coverage according to claim 12, further comprising:
adding the bridge fault test pattern for detecting the bridge fault occurring in the non-detected adjacent pair of wiring lines having the largest weight of the bridge fault to the bridge fault test pattern of the target whose fault coverage is detected.

14. The calculation method of a fault coverage according to claim 12, further comprising;

selecting, in descending order of a weight such that a total sum of weights of detectable adjacent pairs of wiring lines is larger than a prescribed value, the plurality of non-detected adjacent pair of wiring lines whose the bridge fault is not detected;

generating a bridge fault test pattern for detecting a bridge fault occurring in the plurality of non-detected adjacent pair of wiring lines.

15. The calculation method of a fault coverage according to claim 14, wherein the prescribed value is equal to or more than a total sum of weights of all adjacent pairs of wiring lines.

16. A fault detecting method, comprising:

extracting, via a central processing unit (CPU), wiring-line pair information indicating a length and an interval of each adjacent pair of wiring lines which fall within a first interval range where a bridge fault incidence is higher than a predetermined value and bridge fault information respectively corresponding to the adjacent pair of wiring lines, the bridge fault information being obtained from layout information of a semiconductor integrated circuit included in a layout information area;

storing the wiring-line pair information in a wiring information area;

storing the bridge fault information in a fault information area;

performing, via a CPU, a determination test for determining whether a bridge fault occurs in the adjacent pair of wiring lines by using a bridge fault test pattern of a target;

storing a result of the determination test in a determination result area;

calculating, via a CPU, a weighted bridge fault coverage for the bridge fault test pattern by weighting each adjacent pair of wiring lines with the length and the interval thereof, based on the wiring-line pair information, the bridge fault information, the result of the determination test including information on whether the bridge fault occurring in the adjacent pair of wiring lines is detected, and an interval-dependent bridge fault incidence which are read out from the wiring information area, the determination result area, and the fault incidence area, respectively;

and allowing a tester to apply the bridge fault test pattern whose bridge fault coverage is calculated to perform a bridge fault test on the semiconductor integrated circuit.

17. The fault detection method according to claim 16, wherein a bridge fault occurs between the adjacent pair or wiring lines within the first interval range.

18. The fault detection method according to claim 16, wherein the first interval range is set based on a minimum pitch between the adjacent pair of wiring lines of a large-scale integration to which the bridge fault test pattern is applied.

19. The calculation method of a fault coverage according to claim 16, wherein the bridge fault of the adjacent pair of wiring lines is a bridge fault activated therein.

\* \* \* \* \*